United States Patent
Akimune et al.

(10) Patent No.: US 6,903,495 B2
(45) Date of Patent: Jun. 7, 2005

(54) PIEZOELECTRIC MATERIAL AND METHOD FOR MANUFACTURE THEREOF

(75) Inventors: Yoshio Akimune, Ibaraki-ken (JP); Fumio Munakata, Tokyo (JP); Mikiya Shinohara, Kanagawa-ken (JP)

(73) Assignee: Nissan Motor Co., Ltd., Yokohama (JP)

(*) Notice: Subject to any disclaimer, the term of this patent is extended or adjusted under 35 U.S.C. 154(b) by 453 days.

(21) Appl. No.: 10/173,975

(22) Filed: Jun. 19, 2002

(65) Prior Publication Data

US 2003/0151331 A1 Aug. 14, 2003

Related U.S. Application Data

(60) Provisional application No. 60/299,177, filed on Jun. 20, 2001.

(51) Int. Cl.⁷ .................................. H01L 41/09
(52) U.S. Cl. ....................................... 310/358
(58) Field of Search ................. 310/357–359, 310/328; 252/62.9–63.5; 29/25.35

(56) References Cited

U.S. PATENT DOCUMENTS

| | | | | | |
|---|---|---|---|---|---|
| 3,640,865 A | * | 2/1972 | Burns et al. | ........... | 252/62.9 R |
| 3,823,998 A | * | 7/1974 | Yazaki et al. | ............... | 359/251 |
| 4,048,546 A | * | 9/1977 | Bouchard et al. | ........ | 361/321.5 |
| 4,726,099 A | * | 2/1988 | Card et al. | ................. | 29/25.35 |

FOREIGN PATENT DOCUMENTS

| JP | 62-202576 | 9/1987 |
|---|---|---|
| JP | 10-297969 | 11/1998 |
| JP | 2000-169229 | 6/2000 |

OTHER PUBLICATIONS

Smolenskii et al., "New Ferroelectrics of Complex Composition. IV," Soviet Physics—Solid State, vol. 2, No. 11, May 1961, pp. 2651–2654, Institute for Semiconductors, Academy of Sciences of the USSR, Leningrad.

Takenaka et al., "Piezoelectric Properties of $(Bi_{1/2}Na_{1/2})TiO_3$–Based Ceramics," Ferroelectrics, vol. 106, 1990, pp. 375–380, Gordon and Breach Publishers S.A., USA.

Sakamoto et al., "Anomalous electro–optic properties of ferroelectric strontium barium niobate and their device applications," Appl. Phys. Lett., vol. 22, No. 9, May 1, 1973, pp. 429–431, American Institute of Physics.

Neurgaonkar et al., "Piezoelectricity in Tungsten Bronze Crystals, " Ferroelectrics, vol. 160, 1994, pp. 265–276, Gordon and Breach Science Publishers S.A., USA.

* cited by examiner

*Primary Examiner*—Thomas M. Dougherty
*Assistant Examiner*—Karen Addison
(74) *Attorney, Agent, or Firm*—Foley & Lardner LLP

(57) ABSTRACT

A piezoelectric material includes a polycrystalline piezoelectric compound having a component composition defined as $Sr_{2-x}Ca_xNaNb_5O_{15}$, where x=0.05 to 0.35, and at least one rare earth oxide compound selected from the group consisting of $Y_2O_3$, $La_2O_3$, $Dy_2O_3$, $Nd_2O_3$, $Yb_2O_3$, $Sm_2O_3$, $Er_2O_3$, $Gd_2O_3$ and $Pr_6O_{11}$ to be added to the piezoelectric compound by 0.5 to 3.0 wt %. Moreover, a method of manufacturing the piezoelectric material includes blending ceramic materials, synthesizing, milling, pressing and sintering processes. In the synthesizing process, calcining is conducted at a temperature in a range from 1,050° C. to 1,150° C. for 2 to 12 hours in the atmosphere. And the sintering process includes first firing at temperature in a range from 1,180° C. to 1,270° C. for 4 to 8 hours in the atmosphere, and second firing at a temperature in a range from 1,370° C. to 1,400° C. for 10 to 75 hours in the atmosphere.

18 Claims, No Drawings

PIEZOELECTRIC MATERIAL AND METHOD FOR MANUFACTURE THEREOF

BACKGROUND OF THE INVENTION

1. Field of the Invention

This invention relates to poly-crystal compound piezoelectric materials possessing piezoelectricity for use in actuators as positioning mechanisms in precision instruments and apparatuses, actuators as driving sources for fluid control valves, and pressure sensors, for example. The invention also relates to methods of manufacturing the piezoelectric materials.

2. Description of the Related Art

Barium titanate (BT: $BaTiO_3$), lead titanate (PT: $PbTiO_3$), lead zirconium titanate (PZT: $PbZrO_3$—$PbTiO_3$) and the like have been reported as piezoelectric ceramics. Among them, PZT has been widely used for actuators, pressure sensors and the like owing to the largest displacement value.

Of those ceramics, BT was found out to be a ferroelectric substance in 1942. Since then, BT turned out to be usable for ceramic polycrystalline, and numerous studies have been therefore pursued to find usage as capacitors, actuators and the like. Meanwhile, there was a discovery in 1955 that PZT possessed an electromechanical stiffness constant more than twice of BT. Since then, PZT has been dominantly used in actuators, buzzers and the like.

However, in recent years, environmental issues on hazardous substances are considered to be more important. Accordingly, needs in developing lead-free piezoelectric materials are increasing. For example, studies on piezoelectric materials using a $Bi_{0.5}Na_{0.5}TiO_3$ (BNT) compound discovered in 1961 (Smolensky et al., Soviet Physics Solid State [2] 2651–54, (1961)) are now in progress.

Japanese Patent Publication Sho 62-202576 (published in 1987) disclosed piezoelectric ceramic using a BNT-$MTiO_3$ (M; Ba, $K_{0.5}Bi_{0.5}$) compound. However, this ceramic has a defect of generating lateral vibration interference and expanding vibration when used in an ultrasonic flaw detector or a thickness gauge, because a stiffness constant Kp in a radial direction of BNT-$MTiO_3$ is greater than a stiffness constant Kt in a thickness direction thereof.

Similarly, BNT-$MTiO_3$ (M; Sr, Ca, Pb) was reported in a thesis by T. Takenaka et al. (Ferroelectrics, Vol.106, pp.375–380, (1990)). However, a piezoelectric constant $d_{33}$ of BNT-$MTiO_3$ reported therein is about 120 pC/N, which is about ¼ of PZT.

Moreover, characteristics as an electro-optic crystal were reported concerning $Sr_{1-x}Ba_xNb_2O_6$ (SBN) formed into a single crystal in a range of x=0.5 to 0.7 (S. Sakamoto and T. Yazaki, Appl. Phys. Letters Vol.22, p.429, (1973)). Since then, SBN has been used for infrared detectors and surface acoustic wave filters. Meanwhile, piezoelectric characteristics have been reported on a single crystal of $Sr_{2-x}Ca_xNaNb_5O_{15}$ by R. R. Neurgaonkar et al. (Ferroelectrics, Vol.160, pp.265–276, (1994)). Furthermore, $Ba_{2-x}Sr_xNaNb_5O_{15}$ has been developed as a material for filters (Japanese Patent Publication H10-297969 (published in 1998)).

SUMMARY OF THE INVENTION

Manufacture of PZT piezoelectric ceramics requires anti-pollution measures because lead compounds are decomposed in calcining and sintering processes and thereby discharged to the atmosphere, or discharged to water in a powder forming process. Therefore, high product costs are incurred.

Moreover, upon using products including the PZT piezoelectric ceramics, shredder dust of end products contains lead. Accordingly, there is rising concern under waste regulations in recent years that the lead may pollute the environment. Furthermore, PZT also has a performance problem that it is difficult to incorporate PZT into circuits because of high dielectric constant. In addition, since PZT generates substantial heat during usage, application of PZT to actuators for continuous use is limited.

$Sr_{1-x}Ba_xNb_2O_6$ (SBN) is frequently used in a form of a single crystal. A single crystal of SBN possesses a piezoelectric constant $d_{33}$ of about 600 pC/N, which is a characteristic value equivalent to PZT. However, such a piezoelectric characteristic is exerted in a Curie temperature (Tc) range from 60° C. to 75° C. Therefore, considering heat generation by vibration, usage of SBN is limited to a condition at a room temperature; accordingly, application of SBN to various machine parts is difficult.

Moreover, since SBN compounds are full-range solid solutions, it is reported that an SBN compound tends to incur composite displacement easily, whereby characteristics thereof may vary during processing or use due to occurrence of composite displacement. In order to improve such a characteristic, it is also reported that $Y_2O_3$, $CeO_2$ or $La_2O_3$ is doped upon formation of a single crystal of SBN. Nevertheless, any technical reports on usage of $Sr_{2-x}Ca_xNaNb_5O_{15}$ are yet to be found. Furthermore, concerning $Ba_{2-x}Sr_xNaNb_5O_{15}$, a piezoelectric constant $d_{33}$ thereof only remains in a range from some 30 to 50 pC/N, which is practically inadequate.

It is an object of the invention to provide perovskite compound piezoelectric materials without containing hazardous lead.

A piezoelectric material according to a first aspect of the invention includes a polycrystalline material having a component composition defined as $Sr_{2-x}Ca_xNaNb_5O_{15}$. Here, the subindex x is set in a range from 0.05 to 0.35. Further, at least any one substance selected from the rare earth oxide group consisting of $Y_2O_3$, $La_2O_3$, $Dy_2O_3$, $Nd_2O_3$, $Yb_2O_3$, $Sm_2O_3$, $Er_2O_3$, $Gd_2O_3$ and $Pr_6O_{11}$ is added the piezoelectric material as a characteristic improving component. Moreover, an amount of the added rare earth oxide is set in a range from 0.5 to 3.0 wt %.

An actuator according to a second aspect of the invention uses the piezoelectric material according to the first aspect.

A method of manufacturing a piezoelectric material according to a third aspect of the invention is a method of manufacturing the piezoelectric material according to the first aspect. Here, the method includes blending raw materials for composing the polycrystalline material and the rare earth oxide, synthesizing the material by calcining the blended materials obtained by blending process, under a condition at a temperature range from 1,050° C. to 1,150° C. for 2 to 12 hours, milling a calcined material or powder by the synthesizing process, pressing powder obtained by the milling process, and sintering a compact obtained by the pressing process.

A piezoelectric material according to a fourth aspect of the invention includes a polycrystalline material defined as $Sr_{2-x}A_xNaNb_5O_{15}$. Here, the x is a value in a range from 0.075 to 0.25. Moreover, the index A refers to at least two elements selected from the group consisting of Ca, Ba and Mg.

An actuator according to a fifth aspect of the invention uses the piezoelectric material according to the fourth aspect.

A method of manufacturing a piezoelectric material according to a sixth aspect of the invention is a method of manufacturing the piezoelectric material according to the fourth aspect. Here, the method includes blending raw materials for composing the polycrystalline material, synthesizing the material by calcining the blended materials obtained by blending process, under a condition at a temperature range from 1,050° C. to 1,150° C. for 2 to 12 hours, milling calcined powder obtained by the synthesizing process, pressing powder obtained by the milling process, and sintering a compact obtained by the pressing process.

DESCRIPTION OF THE PREFERRED EMBODIMENTS (First Embodiment)

A piezoelectric material according to a first embodiment of the invention and a manufacturing method thereof are concerning a polycrystalline material based on a component composition defined as $Sr_{2-x}Ca_xNaNb_5O_{15}$. Here, x is a value in a range from 0.05 to 0.35. More preferably, a rare earth oxide compound is subjected to solid solution by a solid state reaction sintering method in order to improve characteristics of the piezoelectric material, and conventional ceramic manufacturing conditions are applied. In this way, it is made possible to manufacture a polycrystal which satisfies required characteristic values.

In order to manufacture the compound defined as $Sr_{2-x}Ca_xNaNb_5O_{15}$, reaction is firstly conducted under a condition at a temperature range from 1,050° C. to 1,150° C. for 2 to 12 hours by way of calcination. Next, calcinated powder thus obtained is ball-milled into grain sizes in a range from 0.5 to 0.8 μm preferably. Thereafter, first firing stage is conducted under a condition at a temperature range from 1,180° C. to 1,270° C. for 4 to 8 hours in the atmosphere, for example. In addition, second firing stage is conducted under a condition at a temperature range from 1,370° C. to 1,400° C. for 10 to 75 hours in the atmosphere, for example. In this way, a high-quality lead-free piezoelectric material is obtained.

In the following, conditions for manufacturing $Sr_{2-x}Ca_xNaNb_5O_{15}$ will be described further in detail. First, given amounts of commercially available reagents of $SrCO_3$, $CaCO_3$, $Na_2CO_3$ and $Nb_2O_5$ are weighed, and these substances are used as a base composite. Such a base composite is arranged so as to set the x value in the component composition defined as $Sr_{2-x}Ca_xNaNb_5O_{15}$ in a range from 0.05 to 0.35 (equivalent to 5 to 35 mol %). In order to improve characteristics, at least any one substance selected from the rare earth oxide group consisting of $Y_2O_3$, $La_2O_3$, $Dy_2O_3$, $Nd_2O_3$, $Yb_2O_3$, $Sm_2O_3$, $Er_2O_3$, $Gd_2O_3$ and $Pr_6O_{11}$ is weighed and added such that the total rare earth oxide constitutes 0.5 to 3.0 wt % of the base mixture.

The x value of the base composite defined as $Sr_{2-x}Ca_xNaNb_5O_{15}$ is preferred to remain in the foregoing range, because the piezoelectric material will possess a low heat-resistance temperature and cause degradation by self-heating if the x value is lower than the foregoing range. Piezoelectric constants will run short if the x value is excessive. Meanwhile, if the content of the rare earth compound for characteristic improvement is too small, then an effect of piezoelectric constant improvement tends to be insufficient. On the contrary, if the content is excessive, then the characteristic improvement tends to be reduced because an undesired compound is deposited.

Further, in order to effectively improve the characteristic of the piezoelectric material by adding the rare earth oxide, it is preferable that the x is set in a range of 0.1 to 0.2. With an application to an actuator, if the relative dielectric constant of the piezoelectric material is low, the actuator can be driven by use of a power source supplying a small current. Therefore the piezoelectric material having low relative dielectric constant is suitable for the actuator. For example, it is preferable that the x is set to 1 and $La_2O_3$ is added to the base composite so as to constitute 0.5 to 3.0 wt % of the base composite. The piezoelectric material added $La_2O_3$ of 2 wt % shows the best characteristic in which the piezoelectric constant $K_{33}$ reach 40 and an electric mechanic energy conversion efficiency is high.

Subsequently, the above-described blended powder is milled and blended for about 24 hours in alcohol, for example, by use of a ball mill. The blended powder thus obtained is subjected to drying by use of a rotary evaporator, and then subjected to calcined for synthesis under a condition at a temperature preferably in a range from 1,050° C. to 1,150° C., here at 1,100° C., for example, for 2 to 12 hours in the atmosphere, for example, so as to promote reaction of the elements. In this event, if the calcining temperature is below 1,050° C., $Na_2CO_3$ and $SrCO_3$ do not react sufficiently and composition will become to be uneven in sintering process because of the insufficient reaction. Therefore, the characteristics will not be improved. If the temperature is above 1,150° C., then partial sintering is caused and milling thereby becomes difficult. In addition, uneven composition is incurred upon sintering. Sufficient reaction is not achieved if the calcining time is less than 2 hours. On the contrary, if the calcining time exceeds 12 hours, reaction with a sagger is caused in addition to the reaction inside the powder. Therefore, segregation of the components is incurred.

Thereafter, the calcined material is again subjected to ball-milling for about 24 hours in alcohol by use of the ball mill and then subjected to drying by use of the rotary evaporator. Thereafter, the ball-milled powder is pressed and the compact is subjected to sintering. In this sintering process, first firing stage is conducted under a condition at a temperature in a range from 1,180° C. to 1,270° C. for 4 to 8 hours in the atmosphere. Further, the material is subjected to second firing stage under a condition at a temperature in a range from 1,370° C. to 1,400° C. for 10 to 75 hours in the atmosphere. Milling of the calcined powder prior to sintering after synthesis is preferably conducted so as to form grain sizes of the powder in a range from 0.5 μm to 0.8 μm inclusive. In other words, if the grain sizes of the powder are below 0.5 μm, then it is difficult to handle the powder during the pressing process. On the contrary, if the grain sizes exceed 0.8 μm, then it is difficult to sinter the powder.

Of the above-mentioned sintering process, the first firing process has a function to progress sintering of a compact slowly. At the firing temperature in the first firing process, a sintering neck is not formed if the firing time is less than 4 hours, and a temperature rise thereafter causes a porous product. If the firing time exceeds 8 hours, then sintering progresses excessively and thereby causes a product with large grain sizes. Such a product incurs deterioration in the piezoelectric constants. Meanwhile, if the temperature during the second firing process is below 1,370° C. and the firing time is less than 10 hours, then sintering will be achieved insufficiently. Moreover, if the temperature exceeds 1,400° C. and the firing time exceeds 75 hours upon sintering, then the grains are fused or formed coarsely. Such a product cannot be polarized and does not exhibit piezoelectric characteristics.

After sintering, the sintered body is processed into a cylinder of a 6-mm diameter and an 8-mm height, for example, to make a sample. The sample is subjected to density measurement and X-ray diffraction to check the components. Then, gold is deposited on both edges of the sample and the sample is polarized under a condition of 8 V/mm (at 180° C.). Thereafter, piezoelectric constants $d_{33}$ and $K_{33}$, a Curie temperature and a relative dielectric constant of the sample are measured. If the piezoelectric constant $d_{33}$ of the sample exceeds 200 pC/N (preferably 250 pC/N), then it is possible to gain a sufficient displacement amount as an actuator for driving a machine part.

Evaluation of micro structures of the sintered body is conducted as measurement of average grain sizes by use of a scanning electron microscope (SEM). A SEM photograph of the sintered body is taken, and then ten parallel straight lines are drawn on the SEM image. Accordingly, average grain lengths of the grains intersecting the straight lines are determined as the average grain sizes. Here, it should be noted that the number of the straight lines to be drawn on the SEM image is not always limited to 10 lines.

As described above, the piezoelectric material according to the first embodiment of the invention includes the polycrystalline piezoelectric compound having the component composition defined as $Sr_{2-x}Ca_xNaNb_5O_{15}$, in which the x value is set in a range from 0.05 to 0.35, and at least any one substance selected from the rare earth oxide group consisting of $Y_2O_3$, $La_2O_3$, $Dy_2O_3$, $Nd_2O_3$, $Yb_2O_3$, $Sm_2O_3$, $Er_2O_3$, $Gd_2O_3$ and $Pr_6O_{11}$ is added thereto by 0.5 to 3.0 wt % as the characteristic improving component. Therefore, lead compounds are not discharged in the manufacturing process unlike conventional PZT and PT. Moreover, if the piezoelectric material is applied to end products and the products are disposed thereafter, shredder dust of the discarded products will not contain lead compounds. In addition, the above-described piezoelectric material can be low dielectric constant as compared to PZT. Accordingly, the piezoelectric material can provide flexibility upon circuit designing. Furthermore, since the piezoelectric material is a polycrystalline material, the manufacturing process is not associated with time consumption and complexity of polarization as compared with the manufacturing process of a single-crystal material. Therefore, manufacturing the piezoelectric material is easier and less costly than manufacturing the single-crystal material, whereby the piezoelectric material is suitable for practical use.

The piezoelectric material according to the first embodiment is a sintered body. Here, the sizes of crystal grains of the sintered body are controlled to the average grain sizes in a range from 3 to 20 $\mu$m, which is based on the values determined according to the average grain lengths intersecting parallel straight lines (of an arbitrary number) drawn on a SEM photograph image by use of an imaging apparatus. Accordingly, it is possible to provide the piezoelectric material having fine sintering performance and excellent piezoelectric characteristics.

Moreover, the piezoelectric material according to the first embodiment can be used as drive sources for positioning actuators in precision machinery and for fluid control valves.

The method of manufacturing the piezoelectric material according to the first embodiment includes the blending process of the ceramics raw materials, the synthesizing process, the milling process, the pressing process and the sintering process. In the synthesizing process, the materials are calcined under a condition at a temperature in a range from 1,050° C. to 1,150° C. for 2 to 12 hours. In addition, in the sintering process, first firing stage is conducted under a condition at a temperature in a range from 1,180° C. to 1,270° C. for 4 to 8 hours, and then second firing stage is conducted under a condition at a temperature in a range from 1,370° C. to 1,400° C. for 10 to 75 hours. By this sintering process, it is possible to manufacture the piezoelectric material having high density, small grain sizes after sintering, and excellent piezoelectric characteristics. Note that it is possible to manufacture the piezoelectric material having high density, small grain sizes after sintering, and excellent piezoelectric characteristics, by conducting first firing and second firing continuously.

Moreover, when the synthesizing process and firing in the sintering process are conducted in the atmosphere, it is possible to manufacture the piezoelectric material excellent in the piezoelectric characteristics in a relatively simple facility as a mass production method.

Furthermore, if the grain sizes of the powder are adjusted in a range from 0.5 to 0.8 $\mu$m prior to the sintering process, it is possible to facilitate handling upon pressing and to improve sintering performance, whereby manufacturing the piezoelectric material with excellent piezoelectric characteristics becomes feasible.

(Second Embodiment)

A piezoelectric material according to a second embodiment of the invention concerns a polycrystalline material based on a component composition defined as $Sr_{2-x}A_xNaNb_5O_{15}$. Here, the element A refers to other alkaline earth elements. The x value is in a range from 0.075 to 0.25. This polycrystalline material can be provided so as to satisfy necessary characteristic values by use of the conventional ceramic manufacturing process.

In order to manufacture the compound defined as $Sr_{2-x}A_xNaNb_5O_{15}$, reaction is firstly conducted under a condition at a temperature range from 1,050° C. to 1,150° C. for 2 to 12 hours by way of synthesis. Next, calcined material thus obtained is milled into grain sizes in a range from 0.5 to 0.8 $\mu$m preferably. Thereafter, first firing is conducted under a condition at a temperature range from 1,200° C. to 1,250° C. for 4 to 8 hours in the atmosphere, for example. In addition, second firing is conducted under a condition at a temperature range from 1,270° C. to 1,370° C. for 10 to 50 hours in the atmosphere, for example. In this way, a high-quality lead-free piezoelectric material is obtained.

In the following, conditions for manufacturing $Sr_{2-x}A_xNaNb_5O_{15}$ will be described further in detail. First, given amounts of commercially available reagents of $SrCO_3$, $Na_2CO_3$ and $Nb_2O_5$ and carbonate of the element "A" are weighed, and these substances are used as a base composite. Concerning a base composite ratio in this case, the x value in the component composition defined as $Sr_{2-x}A_xNaNb_5O_{15}$ is set in a range from 0.075 to 0.25. The element A in this composite includes at least two elements selected from Ca, Ba and Mg.

With the combination of Ca, Ba and Mg, a combination of two elements is more advantageous than one of three elements for manufacturing. Further, it is preferable that a part of Ca component, which is composed of the base material of $Sr_{2-x}Ca_xNaNb_5O_{15}$, is substituted by Ba or Mg.

Here, the reason why the x value of the base composite defined as $Sr_{2-x}A_xNaNb_5O_{15}$ is preferred to remain in the foregoing range is that the piezoelectric material will possess a low heat-resistance temperature and cause degradation by self-heating if the x value is lower than the foregoing range, and that the piezoelectric constants will run short if the x value is excessive. Meanwhile, if the content of the element A for characteristic improvement is too small, then an effect of piezoelectric constant improvement tends to be insufficient. On the contrary, if the content is excessive, then the characteristic improvement tends to be inhibited because an undesired compound is deposited.

Subsequently, the above-described blended powder is milled and blended for about 24 hours in alcohol, for example, by use of a ball mill. The blended powder thus milled is subjected to drying by use of a rotary evaporator, and then subjected to calcining for synthesis under a condition at a temperature preferably in a range from 1,050° C. to 1,150° C., here at 1,100° C., for example, for 2 to 12 hours in the atmosphere, for example, so as to promote reaction of the elements. In this event, $Na_2CO_3$ and $SrCO_3$ do not react sufficiently if the calcining temperature is below 1,050° C., and composition will become to be uneven in sintering process because of the insufficient reaction. Therefore, the characteristics will not be improved. If the temperature exceeds 1,150° C., then the blended powder causes partial sintering and milling thereby becomes difficult. In addition, uneven composition is also incurred in sintering process. Sufficient reaction is not achieved if the calcining time is less than 2 hours. On the contrary, if the calcining time exceeds 12 hours, reaction with a sagger is caused in addition to the reaction inside the powder. Therefore, segregation of the components is incurred.

Thereafter, the calcined and blended powder is again subjected to milling for about 24 hours in alcohol by use of the ball mill and then subjected to drying by use of the rotary evaporator. Thereafter, the powder is pressed and the compact is subjected to sintering. In this sintering process, first firing stage is conducted under a condition at a temperature in a range from 1,200° C. to 1,250° C. for 4 to 8 hours in the atmosphere. Further, the material is subjected to second firing stage under a condition at a temperature in a range from 1,270° C. to 1,370° C. for 10 to 50 hours. Milling of the calcined powder prior to sintering after synthesis is preferably conducted so as to form grain sizes of the powder in a range from 0.5 $\mu$m to 0.8 $\mu$m. In other words, if the grain sizes of the powder are below 0.5 $\mu$m, then it is difficult to handle the powder during the pressing process. On the contrary, if the grain sizes exceed 0.8 $\mu$m, then it is difficult to sinter the powder.

Of the above-mentioned sintering process, the first firing process has a function to progress sintering of the compact slowly. At the firing temperature in the first firing process, a sintering neck is not formed if the firing time is less than 4 hours, and a temperature rise thereafter causes a porous product. If the firing time exceeds 8 hours, then sintering progresses excessively and thereby causes a product with large grain sizes. Such a product incurs deterioration in piezoelectric constants by an increase in the number of pores. Meanwhile, if the temperature during the second firing process is below 1,270° C. and the firing time is less than 10 hours, then sintering will be achieved insufficiently. Moreover, if the temperature exceeds 1,370° C. and the firing time exceeds 50 hours, then the grains are fused or formed coarsely. Such a product cannot be polarized and does not exhibit piezoelectric characteristics.

After sintering, the sintered body is processed into a cylinder of a 6-mm diameter and an 8-mm height, for example, to produce a sample. The sample is subjected to density measurement and X-ray diffraction to check the components. Then, gold is deposited on both edges of the sample and the sample is polarized under a condition of 8 V/mm (at 180° C.). Thereafter, piezoelectric constants $d_{33}$ and $K_{33}$, a Curie temperature and a relative dielectric constant of the sample are measured. If the piezoelectric constant of the sample exceeds 200 pC/N (preferably 250 pC/N), then it is possible to gain a sufficient displacement amount as an actuator for driving a machine part.

Evaluation of micro structures of the sintered body is conducted as measurement of average grain sizes by use of a SEM. A SEM photograph of the sintered body is taken, and then ten parallel straight lines are drawn on the SEM image. Accordingly, average grain lengths of the grains intersecting the straight lines are determined as the average grain sizes. Here, it should be noted that the number of the straight lines to be drawn on the SEM image is not always limited to 10 lines.

The piezoelectric material according to the second embodiment of the invention is the polycrystalline piezoelectric material having the component composition defined as $Sr_{2-x}A_xNaNb_5O_{15}$. Here, the x value is set in a range from 0.075 to 0.25, and the element A includes at least two elements selected from Ca, Ba and Mg. Therefore, lead compounds are not discharged in the manufacturing process unlike conventional PZT and PT. Moreover, if the piezoelectric material is applied to end products and the products are discarded thereafter, shredder dust of the discarded products will not contain lead compounds. In addition, the above-described piezoelectric material has low dielectric constant as compared to PZT. Accordingly, the piezoelectric material can provide flexibility upon circuit designing. Furthermore, since the piezoelectric material is a polycrystalline material, the manufacturing process is not associated with time consumption and complexity of polarization as compared with the manufacturing process of a single-crystal material. Therefore, manufacturing the piezoelectric material is easier and less costly than manufacturing the single-crystal material, whereby the piezoelectric material is suitable for practical use.

Moreover, the piezoelectric material according to the second embodiment can be used as drive sources for positioning actuators in precision machinery and for fluid control valves.

The method of manufacturing the piezoelectric material according to the second embodiment includes the blending process of the ceramics raw materials, the synthesizing process, the milling process, the pressing process and the sintering process. In the synthesizing process, the materials are calcined under a condition at a temperature in a range from 1,050° C. to 1,150° C. for 2 to 12 hours. In addition, in the sintering process, first firing stage is conducted under a condition at a temperature in a range from 1,200° C. to 1,250° C. for 4 to 8 hours, and then second firing stage is conducted under a condition at a temperature in a range from 1,270° C. to 1,370° C. for 10 to 50 hours. By this sintering process, it is possible to manufacture the piezoelectric material having high density, small grain sizes after sintering, and excellent piezoelectric characteristics.

Note that it is possible to manufacture the piezoelectric material having high density and excellent piezoelectric characteristics, by conducting first firing and second firing continuously.

Moreover, when the synthesizing process and firing in the sintering process are conducted in the atmosphere, it is possible to manufacture the piezoelectric material providing excellent piezoelectric characteristics in a relatively simple facility as a mass production method.

EXAMPLES

Now, the examples of the invention will be described further in detail with reference to Table 1 to Table 21 in combination with comparative examples. However, it is needless to say that the invention shall not be limited only to the examples as described herein.

Comparative Examples 1 to 7

Table 1

Commercially available $SrCO_3$, $CaCO_3$, $Na_2CO_3$ and $Nb_2O_5$ were prepared and these reagents were weighed such that the x value in the component composition defined as $Sr_{2-x}Ca_xNaNb_5O_{15}$ was set in a range from 0 to 0.4. Although no auxiliary agents to be selected from rare earth oxides were added in Comparative Examples 1 to 6, $La_2O_3$ was added in Comparative Example 7. Each blended powder was subjected to milling and blending for 24 hours in alcohol by use of a ball mill. Subsequently, the blended slurry was dried by use of a rotary evaporator and then subjected to calcining at 1,100° C. for 6 hours in the atmosphere to cause synthetic reaction among the elements. Then, the calcined material was again subjected to crushing for 24 hours in alcohol using the ball mill. In this event, grain sizes of the powder were adjusted to 0.6 μm. The ball-milled powder was dried by use of the rotary evaporator. Thereafter, the ball-milled powder was powder-pressed with a hand-operated press and then pressed under pressure at 2 tonf/cm² with a hydrostatic press. Next, a compact was subjected to sintering as first firing at 1,240° C. to 1,250° C. for 6 hours in the atmosphere, and then the temperature was soon raised up to 1,320° C. for second firing, whereby the compact was subjected to additional sintering for 25 hours.

After sintering, each sintered body was processed into a cylinder of a 6-mm diameter and an 8-mm height. Then, the sintered body was subjected to density measurement and X-ray diffraction to check the components. Then, gold was deposited on both edges of the sintered body and the sintered body was polarized under a condition of 8 V/mm (at 180° C.). Thereafter, piezoelectric constants $d_{33}$ and $K_{33}$, and a relative dielectric constant were measured.

Micro structures of the sintered body were evaluated by use of a scanning electron microscope (SEM). Grain sizes of the sintered body were defined as average grain lengths intersecting 10 parallel straight lines drawn on a SEM image. The results are shown in Table 1.

TABLE 1

| Classifications | Comparative Example 1 | Comparative Example 2 | Comparative Example 3 | Comparative Example 4 | Comparative Example 5 | Comparative Example 6 | Comparative Example 7 |
| --- | --- | --- | --- | --- | --- | --- | --- |
| X value in matrix $Sr_{2-x}Ca_xNaNb_5O_{15}$ | 0 | 0.05 | 0.1 | 0.2 | 0.3 | 0.4 | 0.1 |
| Crystal system of matrix | polycrystal | polycrystal | Polycrystal | polycrystal | polycrystal | polycrystal | Single crystal |
| Additive | not added | not added | not added | not added | not added | not added | $La_2O_3$ |
| Content of the additive (wt. %) | — | — | — | — | — | — | 1.0 |
| Conditions of synthesis | | | | | | | |
| Calcining temperature (° C.) | 1100 | 1100 | 1100 | 1100 | 1100 | 1100 | 1100 |
| Calcining time (hr) | 6 | 6 | 6 | 6 | 6 | 6 | 6 |
| Calcining ambiance | atmospheric | atmospheric | atmospheric | atmospheric | atmospheric | atmospheric | atmospheric |
| Grain sizes of powder (μm) | 0.6 | 0.6 | 0.6 | 0.6 | 0.6 | 0.6 | 0.6 |
| Conditions of sintering | | | | | | | |
| 1st firing temperature (° C.) | 1240 | 1250 | 1250 | 1250 | 1250 | 1250 | 1250 |
| 1st firing time (hr) | 6 | 6 | 6 | 6 | 6 | 6 | 6 |
| 2nd firing temperature (° C.) | 1320 | 1320 | 1320 | 1320 | 1320 | 1320 | 1320 |
| 2nd firing time (hr) | 25 | 25 | 25 | 25 | 25 | 25 | 25 |
| Firing ambiance | atmospheric | atmospheric | atmospheric | atmospheric | atmospheric | atmospheric | atmospheric |
| Grain sizes after sintering (μm) | 5 | 6 | 5 | 5 | 5 | 6 | — |
| Characteristic values | | | | | | | |
| Density ($10^{-3}$ kg/m³) | 4.7 | 4.86 | 4.93 | 4.92 | 4.91 | 4.85 | 5 |
| Relative dielectric constant | 1000 | 1000 | 1050 | 1200 | 1700 | 2100 | 1700 |
| $K_{33}$ (%) | 12 | 30 | 35 | 30 | 30 | 18 | 40 |
| $D_{33}$ (pC/N) | 120 | 200 | 210 | 200 | 200 | 150 | 200 |
| Overall judgment | NG | NG | NG | NG | NG | NG | NG |

According to the evaluation results, as shown in Table 1, the piezoelectric constants $d_{33}$ were 200 pC/N or higher when the x value was set in a range from 0.05 to 0.3. Whereas such samples are usable as actuator materials, those samples did not reach a preferred value of 250 pC/N.

Meanwhile, in Comparative Example 7 where the matrix was a single crystal, the piezoelectric constant $d_{33}$ remained around 200 pC/N in spite of addition of the rare earth oxide as a characteristic improving element.

Examples 1 to 5, and Comparative Examples 8 to 12

Table 2 and Table 3

Commercially available $SrCO_3$, $CaCO_3$, $Na_2CO_3$ and $Nb_2O_5$ were prepared and these reagents were weighed such that the x value in the component composition defined as $Sr_{2-x}Ca_xNaNb_5O_{15}$ was set to 0.1 (that is, set to constitute $Sr_{1.9}Ca_{0.1}NaNb_5O_{15}$) as a base composite. Thereafter, $La_2O_3$ as a rare earth compound for characteristic improvement was weighed and added to the base composite so as to constitute 0.1 to 4.0 wt % of the base composite to prepare several types of blended powder.

Then, each blended powder was subjected to blending and milling for 24 hours in alcohol by use of the ball mill. Subsequently, the blended slurry was dried by use of the rotary evaporator and then subjected to calcining at 1,100° C. for 6 hours in the atmosphere to cause synthetic reaction among the elements. Then, the calcined material was again subjected to ball-milling for 24 hours in alcohol using the ball mill (in this event, grain sizes of the powder were adjusted to 0.6 μm in examples shown in Table 2 and to a range from 0.3 to 1.2 μm in examples shown in Table 3). The ball-milled powder was dried by use of the rotary evaporator. Thereafter, a compact obtained by applying a mode similar to the previous examples was sintered at 1,240° C. for 6 hours in the atmosphere as first firing, and then the temperature was soon raised up to 1,390° C. so that the compact was sintered for 25 hours additionally for second firing.

After sintering, each sintered body was processed into a cylinder of a 6-mm diameter and an 8-mm height. Then, the sintered body was subjected to density measurement and X-ray diffraction to check the components. Then, gold was deposited on both edges of the sintered body and the sintered body was polarized under a condition of 8 V/mm (at 180° C.). Thereafter, the piezoelectric constants $d_{33}$ and $K_{33}$, and a relative dielectric constant were measured.

Micro structures of the sintered body were evaluated by use of the SEM. Grain sizes of the sintered body were defined as average grain lengths intersecting 10 parallel straight lines drawn on a SEM image. The results are shown in Table 2 and Table 3. Note that "OK" in overall judgment in Table 2 and Table 3 indicates that the piezoelectric constant $d_{33}$ corresponding to a 0.2% stretch in a longitudinal direction as an actuator reaches 250 pC/N or higher.

TABLE 2

| Classifications | Comparative Example 8 | Comparative Example 9 | Example 1 | Example 2 | Example 3 | Comparative Example 10 |
|---|---|---|---|---|---|---|
| X value in matrix $Sr_{2-x}Ca_xNaNb_5O_{15}$ | 0.1 | 0.1 | 0.1 | 0.1 | 0.1 | 0.1 |
| Crystal system of matrix | Polycrystal | polycrystal | polycrystal | polycrystal | polycrystal | polycrystal |
| Additive | $La_2O_3$ | $La_2O_3$ | $La_2O_3$ | $La_2O_3$ | $La_2O_3$ | $La_2O_3$ |
| Content of the additive (wt. %) | 0.1 | 0.4 | 0.5 | 2 | 3 | 4 |
| Conditions of synthesis | | | | | | |
| Calcining temperature (° C.) | 1100 | 1100 | 1100 | 1100 | 1100 | 1100 |
| Calcining time (hr) | 6 | 6 | 6 | 6 | 6 | 6 |
| Calcining ambiance | atmospheric | atmospheric | atmospheric | atmospheric | atmospheric | atmospheric |
| Grain sizes of powder (μm) | 0.6 | 0.6 | 0.6 | 0.6 | 0.6 | 0.6 |
| Conditions of sintering | | | | | | |
| 1st firing temperature (° C.) | 1240 | 1240 | 1240 | 1240 | 1240 | 1240 |
| 1st firing time (hr) | 6 | 6 | 6 | 6 | 6 | 6 |
| 2nd firing temperature (° C.) | 1390 | 1390 | 1390 | 1390 | 1390 | 1390 |
| 2nd firing time (hr) | 25 | 25 | 25 | 25 | 25 | 25 |
| Firing ambiance | atmospheric | atmospheric | atmospheric | atmospheric | atmospheric | atmospheric |
| Grain sizes after sintering (μm) | 1.5 | 2 | 4 | 8 | 10 | 15 |
| Characteristic values | | | | | | |
| Density ($10^{-3}$ kg/m³) | 4.4 | 4.63 | 4.92 | 4.92 | 4.93 | 4.7 |
| Relative dielectric constant | 1700 | 1400 | 1060 | 1050 | 1050 | 1000 |
| $K_{33}$ (%) | 15 | 22 | 36 | 40 | 36 | 22 |
| $D_{33}$ (pC/N) | 140 | 180 | 250 | 250 | 255 | 180 |
| Overall judgment | NG | NG | OK | OK | OK | NG |

TABLE 3

| Classifications | Comparative Example 11 | Example 4 | Example 5 | Comparative Example 12 |
|---|---|---|---|---|
| X value in matrix $Sr_{2-x}Ca_xNaNb_5O_{15}$ | 0.1 | 0.1 | 0.1 | 0.1 |
| Crystal system of matrix | polycrystal | polycrystal | polycrystal | polycrystal |
| Additive | $La_2O_3$ | $La_2O_3$ | $La_2O_3$ | $La_2O_3$ |
| Content of the additive (wt. %) | 2 | 2 | 2 | 2 |
| Conditions of synthesis | | | | |
| Calcining temperature (° C.) | 1100 | 1100 | 1100 | 1100 |
| Calcining time (hr) | 6 | 6 | 6 | 6 |
| Calcining ambiance | atmospheric | atmospheric | atmospheric | atmospheric |
| grain sizes of powder (μm) | 0.3 | 0.5 | 0.8 | 1.2 |

TABLE 3-continued

| Classifications | Comparative Example 11 | Example 4 | Example 5 | Comparative Example 12 |
|---|---|---|---|---|
| Conditions of sintering | | | | |
| $1^{st}$ firing temperature (° C.) | 1240 | 1240 | 1240 | 1240 |
| $1^{st}$ firing time (hr) | 6 | 6 | 6 | 6 |
| $2^{nd}$ firing temperature (° C.) | 1390 | 1390 | 1390 | 1390 |
| $2^{nd}$ firing time (hr) | 25 | 25 | 25 | 25 |
| Firing ambiance | atmospheric | atmospheric | atmospheric | atmospheric |
| Grain sizes after sintering ($\mu$m) | 1.8 | 8 | 8 | 12 |
| Characteristic values | | | | |
| Density ($10^{-3}$ kg/m$^3$) | 4.9 | 4.92 | 4.92 | 4.63 |
| Relative dielectric constant | 1600 | 1050 | 1050 | 1050 |
| $K_{33}$ (%) | 20 | 40 | 40 | 24 |
| $D_{33}$ (pC/N) | 170 | 255 | 250 | 180 |
| Overall judgment | NG | OK | OK | NG |

According to the evaluation results, the piezoelectric constant $d_{33}$ reached 250 pC/N or higher and was thereby approved to be sufficiently usable as an actuator material, in the case when the content of the additive was in a range from 0.5 to 3.0 wt % as shown in Table 2 and when the grain sizes of the powder after synthesis were in a range from 0.5 to 0.8 $\mu$m as shown in Table 3. Further Examples 1 to 5 showed lower relative dielectric constants than others. Accordingly, if Examples 1 to 5 are applied to an actuator, a supplying current of a driving source will be able to reduce, therefore, these material is preferable as an actuator material. Especially, when the content of the $La_2O_3$ was 2 wt %, the material showed a high value of $K_{33}$, which is the best characteristic.

Examples 6 to 16, and Comparative Examples 13 and 14

Table 4 and Table 5

Commercially available $SrCO_3$, $CaCO_3$, $Na_2CO_3$ and $Nb_2O_5$ were prepared and these reagents were weighed such that the x value in the component composition defined as $Sr_{2-x}Ca_xNaNb_5O_{15}$ was set to 0.1 (that is, set to constitute $Sr_{1.9}Ca_{0.1}NaNb_5O_{15}$) as a base composite. Thereafter, $Pr_6O_{11}$, $Y_2O_3$, $Yb_2O_3$, $Nd_2O_3$, $Dy_2O_3$, $Er_2O_3$, $Sm_2O_3$, $Gd_2O_3$, $La_2O_3$, $Bi_2O_3$ and $CeO_2$ as rare earth compounds for characteristic improvement were weighed and added to the base mixture severally so as to constitute 1.0 wt % of the base composite to prepare several types of blended powder.

Then, each blended powder was subjected to blending and milling for 24 hours in alcohol by use of the ball mill. Subsequently, the blended slurry was dried by use of the rotary evaporator and then subjected to calcining at 1,100° C. for 6 hours in the atmosphere to cause synthetic reaction among the elements. Then, the calcined material was again subjected to crushing for 24 hours in alcohol using the ball mill (in this event, grain sizes of the powder were adjusted to 0.6 $\mu$m). The ball-milled powder was dried by use of the rotary evaporator. Thereafter, a compact obtained by applying the mode similar to the previous examples was sintered at 1,250° C. for 6 hours in the atmosphere as first firing, and then the temperature was soon raised up to a range from 1,390° C. to 1,400° C. so that the compact was sintered for 25 hours additionally for second firing.

After sintering, each sintered body was processed into a cylinder of a 6-mm diameter and an 8-mm height. Then, the sintered body was subjected to density measurement and X-ray diffraction to check the components. Then, gold was deposited on both edges of the sintered body and the sintered body was polarized under a condition of 8 V/mm (at 180° C.). Thereafter, the piezoelectric constants $d_{33}$ and $K_{33}$, and a relative dielectric constant were measured.

Micro structures of the sintered body were evaluated by use of the SEM. Grain sizes of the sintered body were defined as average grain lengths intersecting 10 parallel straight lines drawn on a SEM image. The results are shown in Table 4 and Table 5.

TABLE 4

| Classifications | Example 6 | Example 7 | Example 8 | Example 9 | Example 10 | Example 11 | Example 12 |
|---|---|---|---|---|---|---|---|
| X value in matrix $Sr_{2-x}Ca_xNaNb_5O_{15}$ | 0.1 | 0.1 | 0.1 | 0.1 | 0.1 | 0.1 | 0.1 |
| Crystal system of matrix | polycrystal | polycrystal | polycrystal | polycrystal | polycrystal | polycrystal | polycrystal |
| Additive | $Pr_6O_{11}$ | $Y_2O_3$ | $Yb_2O_3$ | $Nd_2O_3$ | $Dy_2O_3$ | $Er_2O_3$ | $Sm_2O_3$ |
| Content of the additive (wt %) | 1 | 1 | 1 | 1 | 1 | 1 | 1 |
| Conditions of synthesis | | | | | | | |
| Calcining temperature (° C.) | 1100 | 1100 | 1100 | 1100 | 1100 | 1100 | 1100 |
| Calcining time (hr) | 6 | 6 | 6 | 6 | 6 | 6 | 6 |
| Calcining ambiance | atmospheric | atmospheric | atmospheric | atmospheric | atmospheric | atmospheric | atmospheric |
| Grain sizes of powder ($\mu$m) | 0.6 | 0.6 | 0.6 | 0.6 | 0.6 | 0.6 | 0.6 |

TABLE 4-continued

| Classifications | Example 6 | Example 7 | Example 8 | Example 9 | Example 10 | Example 11 | Example 12 |
|---|---|---|---|---|---|---|---|
| Conditions of sintering | | | | | | | |
| $1^{st}$ firing temperature (° C.) | 1250 | 1250 | 1250 | 1250 | 1250 | 1250 | 1250 |
| $1^{st}$ firing time (hr) | 6 | 6 | 6 | 6 | 6 | 6 | 6 |
| $2^{nd}$ firing temperature (° C.) | 1390 | 1390 | 1400 | 1400 | 1400 | 1400 | 1400 |
| $2^{nd}$ firing time (hr) | 25 | 25 | 25 | 25 | 25 | 25 | 25 |
| Firing ambiance | atmospheric | atmospheric | atmospheric | atmospheric | atmospheric | atmospheric | atmospheric |
| Grain sizes after sintering ($\mu$m) | 5 | 5 | 6 | 5 | 5 | 5 | 5 |
| Characteristic values | | | | | | | |
| Density ($10^{-3}$ kg/m$^3$) | 5.06 | 4.77 | 4.97 | 4.8 | 4.8 | 4.79 | 4.83 |
| Relative dielectric constant | 2050 | 1330 | 1485 | 1500 | 1550 | 1400 | 1620 |
| $K_{33}$ (%) | 36 | 40 | 36 | 40 | 41 | 41 | 36 |
| $d_{33}$ (pC/N) | 250 | 260 | 250 | 250 | 260 | 250 | 250 |
| Overall judgment | OK | OK | OK | OK | OK | OK | OK |

TABLE 5

| Classifications | Example 13 | Comparative Example 13 | Comparative Example 14 | Example 14 | Example 15 | Example 16 |
|---|---|---|---|---|---|---|
| X value in matrix $Sr_{2-x}Ca_xNaNb_5O_{15}$ | 0.1 | 0.1 | 0.1 | 0.1 | 0.1 | 0.1 |
| Crystal system of matrix | polycrystal | polycrystal | polycrystal | polycrystal | polycrystal | polycrystal |
| Additive | $Gd_2O_3$ | $Bi_2O_3$ | $CeO_2$ | $Sm_2O_3$ + $La_2O_3$ | $La_2O_3$ + $Y_2O_3$ | $Y_2O_3$ + $Nd_2O_3$ |
| Content of the additive (wt %) | 1 | 1 | 1 | 1 | 1 | 1 |
| Conditions of synthesis | | | | | | |
| Calcining temperature (° C.) | 1100 | 1100 | 1100 | 1100 | 1100 | 1100 |
| Calcining time (hr) | 6 | 6 | 6 | 6 | 6 | 6 |
| Calcining ambiance | atmospheric | atmospheric | Atmospheric | atmospheric | atmospheric | atmospheric |
| Grain sizes of powder ($\mu$m) | 0.6 | 0.6 | 0.6 | 0.6 | 0.6 | 0.6 |
| Conditions of sintering | | | | | | |
| $1^{st}$ firing temperature (° C.) | 1250 | 1250 | 1250 | 1250 | 1250 | 1250 |
| 1st firing time (hr) | 6 | 6 | 6 | 6 | 6 | 6 |
| 2nd firing temperature (° C.) | 1400 | 1400 | 1390 | 1390 | 1390 | 1390 |
| $2^{nd}$ firing time (hr) | 25 | 25 | 25 | 25 | 25 | 25 |
| Firing ambiance | atmospheric | atmospheric | atmospheric | atmospheric | atmospheric | atmospheric |
| Grain sizes after sintering ($\mu$m) | 7 | 6 | 4 | 5 | 5 | 5 |
| Characteristic values | | | | | | |
| Density ($10^{-3}$ kg/m$^3$) | 4.87 | 4.85 | 4.77 | 4.83 | 4.83 | 4.83 |
| Relative dielectric constant | 1500 | 1450 | 1550 | 1620 | 1620 | 1620 |
| $K_{33}$ (%) | 22 | 20 | 16 | 32 | 32 | 32 |
| $D_{33}$ (pC/N) | 250 | 150 | 140 | 250 | 255 | 255 |
| Overall judgment | OK | NG | NG | OK | OK | OK |

According to the evaluation results, as shown in Table 4 and Table 5, the piezoelectric constant $d_{33}$ reached 250 pC/N or higher and was thereby approved to be sufficiently usable as an actuator material, in the case when the additive rare earth oxide was any one of the rare earth oxides specified in the invention.

Examples 17 to 24, and Comparative Examples 15 to 28

Table 6, Table 7, Table 8 and Table 9

Commercially available $SrCO_3$, $CaCO_3$, $Na_2CO_3$ and $Nb_2O_5$ were prepared and these reagents were weighed such that the x value in the component composition defined as $Sr_{2-x}Ca_xNaNb_5O_{15}$ was set to either 0.1 or 0.2 (that is, set to constitute $Sr_{1.9}Ca_{0.1}NaNb_5O_{15}$ or $Sr_{1.8}Ca_{0.2}NaNb_5O_{15}$) as a base composite. Thereafter, either $La_2O_3$, or $Nd_2O_3$ as a rare earth compound for characteristic improvement was weighed and added to the base composite severally so as to constitute 1.0 wt % of the base composite to prepare several types of blended powder.

Then, each blended powder was subjected to blending and milling for 24 hours in alcohol by use of the ball mill. Subsequently, the blended slurry was dried by use of the rotary evaporator and then subjected to calcining at 1,100°

C. for 6 hours in the atmosphere to cause synthetic reaction among the elements. Then, the calcined material was again subjected to crushing for 24 hours in alcohol using the ball mill (in this event, grain sizes of the powder were adjusted to 0.6 μm). The milled powder was dried by use of the rotary evaporator. Thereafter, a compact obtained by applying the mode similar to the previous examples was sintered at a temperature in a range from 1,150° C. to 1,300° C. for 2 to 10 hours in the atmosphere as first firing, and then the temperature was soon raised up to a range from 1,250° C. to 1,430° C. so that the compact was sintered for 10 to 80 hours additionally for second firing.

After sintering, each sintered body was processed into a cylinder of a 6-mm diameter and an 8-mm height. Then, the sintered body was subjected to density measurement and X-ray diffraction to check the components. Then, gold was deposited on both edges of the sintered body and the sintered body was polarized under a condition of 8 V/mm (at 180° C.). Thereafter, the piezoelectric constants $d_{33}$ and $K_{33}$, and a relative dielectric constant were measured.

Micro structures of the sintered body were evaluated by use of the SEM. Grain sizes of the sintered body were defined as average grain lengths intersecting 10 parallel straight lines drawn on a SEM image. The results are shown in Table 6, Table 7, Table 8 and Table 9.

TABLE 6

| Classifications | Comparative Example 15 | Comparative Example 16 | Example 17 | Example 18 | Comparative Example 17 | Comparative Example 18 |
|---|---|---|---|---|---|---|
| X value in matrix $Sr_{2-x}Ca_xNaNb_5O_{15}$ | 0.1 | 0.1 | 0.1 | 0.1 | 0.1 | 0.1 |
| Crystal system of matrix | polycrystal | polycrystal | polycrystal | polycrystal | polycrystal | polycrystal |
| Additive | $La_2O_3$ | $Nd_2O_3$ | $La_2O_3$ | $Nd_2O_3$ | $La_2O_3$ | $Nd_2O_3$ |
| Content of additive (wt %) | 1 | 1 | 1 | 1 | 1 | 1 |
| Conditions of synthesis | | | | | | |
| Calcining temperature (° C.) | 1100 | 1100 | 1100 | 1100 | 1100 | 1100 |
| Calcining time (hr) | 6 | 6 | 6 | 6 | 6 | 6 |
| Calcining ambiance | atmospheric | atmospheric | atmospheric | atmospheric | atmospheric | atmospheric |
| Grain sizes of powder (μm) | 0.6 | 0.6 | 0.6 | 0.6 | 0.6 | 0.6 |
| Conditions of sintering | | | | | | |
| 1st firing temperature (° C.) | 1200 | 1200 | 1200 | 1200 | 1200 | 1200 |
| 1st firing time (hr) | 6 | 6 | 6 | 6 | 6 | 6 |
| 2nd firing temperature (° C.) | 1250 | 1250 | 1370 | 1390 | 1430 | 1430 |
| 2nd firing time (hr) | 25 | 25 | 25 | 25 | 25 | 25 |
| Firing ambiance | atmospheric | atmospheric | atmospheric | atmospheric | atmospheric | atmospheric |
| Grain sizes after sintering (μm) | 1.8 | 1.6 | 8 | 8 | 12 | 14 |
| Characteristic values | | | | | | |
| Density ($10^{-3}$ kg/m$^3$) | 4.6 | 4.5 | 4.85 | 4.7 | 5 | 4.95 |
| Relative dielectric constant | 1200 | 1200 | 1800 | 1500 | unpolarizable | unpolarizable |
| $K_{33}$ (%) | 20 | 24 | 38 | 36 | — | — |
| $D_{33}$ (pC/N) | 150 | 180 | 260 | 255 | — | — |
| Overall judgment | NG | NG | OK | OK | NG | NG |

TABLE 7

| Classifications | Comparative Example 19 | Comparative Example 20 | Example 19 | Example 20 | Example 21 | Example 22 |
|---|---|---|---|---|---|---|
| X value in matrix $Sr_{2-x}Ca_xNaNb_5O_{15}$ | 0.1 | 0.1 | 0.1 | 0.1 | 0.1 | 0.1 |
| Crystal system of matrix | polycrystal | polycrystal | polycrystal | polycrystal | polycrystal | polycrystal |
| Additive | $La_2O_3$ | $Nd_2O_3$ | $La_2O_3$ | $Nd_2O_3$ | $La_2O_3$ | $Nd_2O_3$ |
| Content of the additive (wt %) | 1 | 1 | 1 | 1 | 1 | 1 |
| Conditions of synthesis | | | | | | |
| Calcining temperature (° C.) | 1100 | 1100 | 1100 | 1100 | 1100 | 1100 |
| Calcining time (hr) | 6 | 6 | 6 | 6 | 6 | 6 |
| Calcining ambiance | atmospheric | atmospheric | atmospheric | atmospheric | atmospheric | atmospheric |
| Grain sizes of powder (μm) | 0.6 | 0.6 | 0.6 | 0.6 | 0.6 | 0.6 |
| Conditions of sintering | | | | | | |
| 1st firing temperature (° C.) | 1250 | 1250 | 1250 | 1250 | 1250 | 1250 |
| 1st firing time (hr) | 6 | 6 | 6 | 6 | 6 | 6 |
| 2nd firing temperature (° C.) | 1300 | 1300 | 1370 | 1390 | 1400 | 1400 |

TABLE 7-continued

| Classifications | Comparative Example 19 | Comparative Example 20 | Example 19 | Example 20 | Example 21 | Example 22 |
|---|---|---|---|---|---|---|
| $2^{nd}$ firing time (hr) | 25 | 25 | 25 | 25 | 25 | 25 |
| Firing ambiance | atmospheric | atmospheric | atmospheric | atmospheric | atmospheric | atmospheric |
| Grain sizes after sintering ($\mu$m) | 6 | 5 | 8 | 8 | 8 | 8 |
| Characteristic values | | | | | | |
| Density ($10^{-3}$ kg/m$^3$) | 4.95 | 4.8 | 4.9 | 4.85 | 4.9 | 4.85 |
| Relative dielectric constant | 1800 | 1500 | 1800 | 1500 | 1800 | 1500 |
| $K_{33}$ (%) | 26 | 16 | 40 | 38 | 30 | 32 |
| $D_{33}$ (pC/N) | 180 | 140 | 255 | 255 | 250 | 260 |
| Overall judgment | NG | NG | OK | OK | OK | OK |

TABLE 8

| Classifications | Comparative Example 21 | Comparative Example 22 | Comparative Example 23 | Comparative Example 24 | Comparative Example 25 |
|---|---|---|---|---|---|
| X value in matrix $Sr_{2-x}Ca_xNaNb_5O_{15}$ | 0.1 | 0.1 | 0.2 | 0.1 | 0.1 |
| Crystal system of matrix | polycrystal | Polycrystal | polycrystal | polycrystal | polycrystal |
| Additive | La$_2$O$_3$ | Nd$_2$O$_3$ | La$_2$O$_3$ | Nd$_2$O$_3$ | La$_2$O$_3$ |
| Content of the additive (wt %) | 1 | 1 | 1 | 1 | 1 |
| Conditions of synthesis | | | | | |
| Calcining temperature (° C.) | 1100 | 1100 | 1100 | 1100 | 1100 |
| Calcining time (hr) | 6 | 6 | 6 | 6 | 6 |
| Calcining ambiance | atmospheric | atmospheric | atmospheric | atmospheric | atmospheric |
| Grain sizes of powder ($\mu$m) | 0.6 | 0.6 | 0.6 | 0.6 | 0.6 |
| Conditions of sintering | | | | | |
| $1^{st}$ firing temperature (° C.) | 1300 | 1250 | 1200 | 1200 | 1200 |
| $1^{st}$ firing time (hr) | 6 | 6 | 2 | 10 | 4 |
| $2^{nd}$ firing temperature (° C.) | 1400 | 1420 | 1350 | 1350 | 1350 |
| $2^{nd}$ firing time (hr) | 25 | 25 | 48 | 25 | 80 |
| Firing ambiance | atmospheric | atmospheric | atmospheric | atmospheric | atmospheric |
| Grain sizes after sintering ($\mu$m) | 11 | 14 | 6 | 5 | 14 |
| Characteristic values | | | | | |
| Density ($10^{-3}$ kg/m$^3$) | | | | 4.8 | 4.9 |
| Relative dielectric constant | unpolarizable | unpolarizable | unpolarizable | 1500 | unpolarizable |
| $K_{33}$ (%) | — | — | — | 19 | — |
| $D_{33}$ (pC/N) | — | — | — | 120 | — |
| Overall judgment | NG | NG | NG | NG | NG |

TABLE 9

| Classifications | Comparative Example 26 | Example 23 | Example 24 | Comparative Example 27 | Comparative Example 28 |
|---|---|---|---|---|---|
| X value in matrix $Sr_{2-x}Ca_xNaNb_5O_{15}$ | 0.2 | 0.1 | 0.1 | 0.2 | 0.2 |
| Crystal system of matrix | polycrystal | polycrystal | polycrystal | polycrystal | polycrystal |
| Additive | Nd$_2$O$_3$ | La$_2$O$_3$ | Nd$_2$O$_3$ | La$_2$O$_3$ | Nd$_2$O$_3$ |
| Content of the additive (wt %) | 1 | 1 | 1 | 1 | 1 |
| Conditions of synthesis | | | | | |
| Calcining temperature (° C.) | 1100 | 1100 | 1100 | 1100 | 1100 |
| Calcining time (hr) | 6 | 6 | 6 | 6 | 6 |
| Calcining ambiance | atmoapheric | atmoapheric | atmospheric | atmospheric | atmospheric |
| Grain sizes of powder ($\mu$m) | 0.6 | 0.6 | 0.6 | 0.6 | 0.6 |
| Conditions of sintering | | | | | |
| $1^{st}$ firing temperature (° C.) | 1200 | 1200 | 1200 | 1150 | 1300 |
| $1^{st}$ firing time (hr) | 8 | 4 | 8 | 6 | 6 |
| $2^{nd}$ firing temperature (° C.) | 1350 | 1400 | 1400 | 1300 | 1300 |
| $2^{nd}$ firing time (hr) | 10 | 72 | 16 | 25 | 25 |
| Firing ambiance | atmospheric | atmospheric | atmospheric | atmospheric | atmospheric |
| Grain sizes after sintering ($\mu$m) | 1.8 | 8 | 3 | 5 | 12 |

TABLE 9-continued

| Classifications | Comparative Example 26 | Example 23 | Example 24 | Comparative Example 27 | Comparative Example 28 |
|---|---|---|---|---|---|
| Characteristic values | | | | | |
| Density ($10^{-3}$ kg/m$^3$) | 4.8 | 4.9 | 4.85 | 4.6 | 4.6 |
| Relative dielectric constant | 1500 | 1800 | 1500 | 1000 | 1050 |
| $K_{33}$ (%) | 18 | 36 | 36 | 20 | 20 |
| $D_{33}$ (pC/N) | 120 | 255 | 260 | 160 | 160 |
| Overall judgment | NG | OK | OK | NG | NG |

According to the evaluation results, as shown in Table 6, Table 7, Table 8 and Table 9, the piezoelectric constant $d_{33}$ reached 250 pC/N or higher and was thereby approved to be sufficiently usable as an actuator material, in the case when the sintering conditions satisfied the conditions specified in the invention.

Examples 25 to 30, and Comparative Examples 29 to 32

Table 10 and Table 11

Commercially available $SrCO_3$, $CaCO_3$, $Na_2CO_3$ and $Nb_2O_5$ were prepared and these reagents were weighed such that the x value in the component composition defined as $Sr_{2-x}Ca_xNaNb_5O_{15}$ was set to 0.2 (that is, set to constitute $Sr_{1.8}Ca_{0.2}NaNb_5O_{15}$) as a base composite. Thereafter, one or two substances selected from $La_2O_3$, $Sm_2O_3$, $Dy_2O_3$ and $Er_2O_3$ as rare earth compounds for characteristic improvement were weighed and added to the base composite severally so as to constitute 2.0 wt % of the base mixture to prepare several types of blended powder.

Then, each blended powder was subjected to blending and milling for 24 hours in alcohol by use of the ball mill. Subsequently, the blended slurry was dried by use of the rotary evaporator and then subjected to calcining at a temperature in a range from 1,000° C. to 1,200° C. for 6 hours in the atmosphere to cause synthetic reaction among the elements. Then, the calcined material was again subjected to milling for 24 hours in alcohol using the ball mill (in this event, grain sizes of the powder were adjusted to 0.6 µm). The milled powder was dried by use of the rotary evaporator. Thereafter, a compact obtained by applying the mode similar to the previous examples was sintered at 1,250° C. for 6 hours in the atmosphere as first firing, and then the temperature was soon raised up to a range from 1,390° C. to 1,430° C. so that the compact was sintered for 25 to 70 hours additionally for second firing.

After sintering, each sintered body was processed into a cylinder of a 6-mm diameter and an 8-mm height. Then, the sintered body was subjected to density measurement and X-ray diffraction to check the components. Then, gold was deposited on both edges of the sintered body and the sintered body was polarized under a condition of 8 V/mm (at 180° C.). Thereafter, the piezoelectric constants $d_{33}$ and $K_{33}$, and a relative dielectric constant were measured.

Micro structures of the sintered body were evaluated by use of the SEM. Grain sizes of the sintered body were defined as average grain lengths intersecting 10 parallel straight lines drawn on a SEM image. The results are shown in Table 10 and 15 Table 11.

TABLE 10

| Classifications | Comparative Example 29 | Comparative Example 30 | Example 25 | Example 26 | Example 27 |
|---|---|---|---|---|---|
| X value in matrix $Sr_{2-x}Ca_xNaNb_5O_{15}$ | 0.2 | 0.2 | 0.2 | 0.2 | 0.2 |
| Crystal system of matrix | polycrystal | polycrystal | polycrystal | polycrystal | polycrystal |
| Additive | $La_2O_3$ | $Sm_2O_3$ | $La_2O_3$ | $Sm_2O_3$ + $La_2O_3$ | $La_2O_3$ |
| Content of the additive (wt %) | 2 | 2 | 2 | 2 | 2 |
| Conditions of synthesis | | | | | |
| Calcining temperature (° C.) | 1000 | 1000 | 1050 | 1050 | 1100 |
| Calcining time (hr) | 6 | 6 | 6 | 6 | 6 |
| Calcining ambiance | atmospheric | atmospheric | atmospheric | atmospheric | atmospheric |
| Grain sizes of powder (µm) | 0.6 | 0.6 | 0.6 | 0.6 | 0.6 |
| Conditions of sintering | | | | | |
| 1$^{st}$ firing temperature (° C.) | 1250 | 1250 | 1250 | 1250 | 1250 |
| 1$^{st}$ firing time (hr) | 6 | 6 | 6 | 6 | 6 |
| 2$^{nd}$ firing temperature (° C.) | 1390 | 1390 | 1390 | 1390 | 1390 |
| 2$^{nd}$ firing time (hr) | 25 | 25 | 50 | 70 | 25 |
| Firing ambiance | atmospheric | atmospheric | atmospheric | atmospheric | atmospheric |
| Grain sizes after sintering (µm) | 1.8 | 1.8 | 6 | 5 | 7 |
| Characteristic values | | | | | |
| Density ($10^{-3}$ kg/m$^3$) | 5 | 4.8 | 5 | 4.8 | 5 |
| Relative dielectric constant | 1500 | 1400 | 1800 | 1600 | 1850 |
| $K_{33}$ (%) | 22 | 22 | 32 | 36 | 40 |
| $D_{33}$ (pC/N) | 180 | 180 | 250 | 255 | 250 |
| Overall judgment | NG | NG | OK | OK | OK |

TABLE 11

| Classifications | Example 28 | Example 29 | Example 30 | Comparative Example 31 | Comparative Example 32 |
|---|---|---|---|---|---|
| X value in matrix $Sr_{2-x}Ca_xNaNb_5O_{15}$ | 0.2 | 0.2 | 0.2 | 0.2 | 0.2 |
| Crystal system of matrix | polycrystal | polycrystal | polycrystal | polycrystal | polycrystal |
| Additive | $Dy_2O_3$ | $Er_2O_3$ | $Sm_2O_3$ | $La_2O_3$ | $Sm_2O_3$ |
| Content of the additive (wt %) | 2 | 2 | 2 | 2 | 2 |
| Conditions of synthesis | | | | | |
| Calcining temperature (° C.) | 1100 | 1150 | 1150 | 1200 | 1200 |
| Calcining time (hr) | 6 | 6 | 6 | 6 | 6 |
| Calcining ambiance | atmospheric | atmospheric | atmospheric | atmospheric | atmospheric |
| Grain sizes of powder (μm) | 0.6 | 0.6 | 0.6 | 0.6 | 0.6 |
| Conditions of sintering | | | | | |
| 1$^{st}$ firing temperature (° C.) | 1250 | 1250 | 1250 | 1250 | 1250 |
| 1$^{st}$ firing time (hr) | 6 | 6 | 6 | 6 | 6 |
| 2$^{nd}$ firing temperature (° C.) | 1390 | 1390 | 1390 | 1430 | 1430 |
| 2$^{nd}$ firing time (hr) | 50 | 25 | 50 | 25 | 25 |
| Firing ambiance | atmospheric | atmospheric | atmospheric | atmospheric | atmospheric |
| Grain sizes after sintering (μm) | 7 | 8 | 8 | 12 | 12 |
| Characteristic values | | | | | |
| Density ($10^{-3}$ kg/m$^3$) | 4.8 | 5 | 4.8 | 5 | 4.8 |
| Relative dielectric constant | 1640 | 1860 | 1640 | 1800 | 1600 |
| $K_{33}$ (%) | 38 | 38 | 38 | 22 | 20 |
| $D_{33}$ (pC/N) | 255 | 260 | 260 | 180 | 140 |
| Overall judgment | OK | OK | OK | NG | NG |

According to the evaluation results, as shown in Table 10 and Table 11, the piezoelectric constant $d_{33}$ reached 250 pC/N or higher and was thereby approved to be sufficiently usable as an actuator material, in the case when the synthesizing conditions and the sintering conditions satisfied the conditions specified in the invention.

Examples 31 to 38, and Comparative Examples 33, 34 and 35

Table 12 and Table 13

Commercially available $SrCO_3$, $CaCO_3$, $BaCO_3$, $Na_2CO_3$ and $Nb_2O_5$ were prepared and these reagents were weighed such that the x value in the component composition defined as $Sr_{2-x}(Ca+Ba)_xNaNb_5O_{15}$ (which is the component composition as described previously where $A=A_1+A_2$, and $A_1$ is Ca and $A_2$ is Ba, respectively) was set to a range from 0 to 0.3 to prepare several types of blended powder.

Then, each blended powder was subjected to blending and milling for 24 hours in alcohol by use of the ball mill. Subsequently, the blended slurry was dried by use of the rotary evaporator and then subjected to calcining at 1,150° C. for 6 hours in the atmosphere to cause reaction among the elements. Then, the calcined material was again subjected to milling for 24 hours in alcohol using the ball mill. The milled powder was dried by use of the rotary evaporator. Thereafter, the milled powder was powder-pressed with the hand-operated press and then pressed under pressure at 2 tonf/cm$^2$ with the hydrostatic press. Next, a compact was sintered at 1,220° C. for 6 hours in the atmosphere as first firing, and then the temperature was soon raised up to 1,300° C. so that the compact was sintered for 25 hours additionally for second firing.

After firing, each sintered body was processed into a cylinder of a 6-mm diameter and an 8-mm height. Then, the sintered body was subjected to density measurement and X-ray diffraction to check the components. Then, gold was deposited on both edges of the sintered body and the sintered body was polarized under a condition of 8 V/mm (at 180° C.). Thereafter, the piezoelectric constants $d_{33}$ and $K_{33}$, and a relative dielectric constant were measured. Further, microstructures of the sintered body were evaluated by use of the SEM. Grain sizes of the sintered body were defined as average grain lengths intersecting 10 parallel straight lines drawn on a SEM image. The results are shown in Table 12 and Table 13.

TABLE 12

| Classifications | Comparative Example 33 | Comparative Example 34 | Example 31 | Example 32 | Example 33 | Example 34 |
|---|---|---|---|---|---|---|
| X value in matrix $Sr_{2-x}A_xNaNb_5O_{15}$ ($A = A_1 + A_2$) | 0 | 0.05 | 0.1 | 0.1 | 0.1 | 0.1 |
| $A_1$: Ca | 0 | 0.025 | 0.01 | 0.03 | 0.07 | 0.09 |
| $A_2$: Ba | 0 | 0.025 | 0.09 | 0.07 | 0.03 | 0.01 |
| Conditions of synthesis | | | | | | |
| Calcining temperature (° C.) | 1150 | 1150 | 1150 | 1150 | 1150 | 1150 |
| Calcining time (hr) | 6 | 6 | 6 | 6 | 6 | 6 |
| Calcining ambiance | Atmospheric | atmospheric | atmospheric | atmospheric | atmospheric | atmospheric |

TABLE 12-continued

| Classifications | Comparative Example 33 | Comparative Example 34 | Example 31 | Example 32 | Example 33 | Example 34 |
|---|---|---|---|---|---|---|
| Conditions of sintering | | | | | | |
| $1^{st}$ firing temperature (° C.) | 1220 | 1220 | 1220 | 1220 | 1220 | 1220 |
| $1^{st}$ firing time (hr) | 6 | 6 | 6 | 6 | 6 | 6 |
| $2^{nd}$ firing temperature (° C.) | 1300 | 1300 | 1300 | 1300 | 1300 | 1300 |
| $2^{nd}$ firing time (hr) | 25 | 25 | 25 | 25 | 25 | 25 |
| Firing ambiance | Atmospheric | atmospheric | atmospheric | atmospheric | atmospheric | atmospheric |
| Grain sizes after sintering ($\mu$m) | 5 | 6 | 5 | 5 | 5 | 5 |
| Characteristic values | | | | | | |
| Density ($10^{-3}$ kg/m$^3$) | 4.7 | 4.86 | 4.9 | 4.92 | 4.91 | 4.92 |
| Relative dielectric constant | 1020 | 1000 | 1120 | 1120 | 1120 | 1140 |
| $K_{33}$ (%) | 12 | 30 | 35 | 35 | 35 | 36 |
| $D_{33}$ (pC/N) | 120 | 200 | 250 | 250 | 250 | 260 |
| Overall judgment | NG | NG | OK | OK | OK | OK |

TABLE 13

| Classifications | Example 35 | Example 36 | Example 37 | Example 38 | Comparative Example 35 |
|---|---|---|---|---|---|
| X value in matrix $Sr_{2-x}A_xNaNb_5O_{15}$ (A = A$_1$ + A$_2$) | 0.2 | 0.2 | 0.2 | 0.2 | 0.3 |
| A$_1$: Ca | 0.02 | 0.06 | 0.14 | 0.18 | 0.15 |
| A$_2$: Ba | 0.18 | 0.14 | 0.06 | 0.02 | 0.15 |
| Conditions of synthesis | | | | | |
| Calcining temperature (° C.) | 1150 | 1150 | 1150 | 1150 | 1150 |
| Calcining time (hr) | 6 | 6 | 6 | 6 | 6 |
| Calcining ambiance | atmospheric | Atmospheric | atmospheric | atmospheric | atmospheric |
| Conditions of sintering | | | | | |
| $1^{st}$ firing temperature (° C.) | 1220 | 1220 | 1220 | 1220 | 1220 |
| $1^{st}$ firing time (hr) | 6 | 6 | 6 | 6 | 6 |
| $2^{nd}$ firing temperature (° C.) | 1300 | 1300 | 1300 | 1300 | 1300 |
| $2^{nd}$ firing time (hr) | 25 | 25 | 25 | 25 | 25 |
| Firing ambiance | atmospheric | atmospheric | atmospheric | atmospheric | atmospheric |
| Grain sizes after sintering ($\mu$m) | 5 | 5 | 5 | 5 | 5 |
| Characteristic values | | | | | |
| Density ($10^{-3}$ kg/m$^3$) | 4.9 | 4.9 | 4.91 | 4.91 | 4.91 |
| Relative dielectric constant | 1130 | 1120 | 1120 | 1120 | 1150 |
| $K_{33}$ (%) | 35 | 35 | 34 | 34 | 25 |
| $D_{33}$ (pC/N) | 250 | 250 | 250 | 250 | 180 |
| Overall judgment | OK | OK | OK | OK | NG |

According to the evaluation results, as shown in Table 12 and Table 13, the piezoelectric constant $d_{33}$ was low and therefore not preferable as an actuator material in Comparative Examples 33, 34 or 35 where the x value was 0, 0.05 or 0.3. On the contrary, the piezoelectric constant $d_{33}$ was high and preferable as an actuator material in each of Examples 31 to 38 where x=0.075 to 0.25 were satisfied.

Examples 39 to 46, and Comparative Examples 36 and 37

Table 14 and Table 15

Commercially available $SrCO_3$, $CaCO_3$, MgO, $Na_2CO_3$ and $Nb_2O_5$ were prepared and these reagents were weighed such that the x value in the component composition defined as $Sr_{2-x}(Ca+Mg)_xNaNb_5O_{15}$ (which is the component composition as described previously where A=A$_1$+A$_3$, and A$_1$ is Ca and A$_3$ is Mg, respectively) was set to a range from 0.05 to 0.3 to prepare several types of blended powder. Then, each blended powder was subjected to blending and milling for 24 hours in alcohol by use of the ball mill. Subsequently, the blended slurry was dried by use of the rotary evaporator and then subjected to calcining at 1,150° C. for 6 hours in the atmosphere to cause reaction among the elements. Then, the calcined material was again subjected to milling for 24 hours in alcohol using the ball mill. The ball-milled powder was dried by use of the rotary evaporator. Thereafter, the ball-milled powder was powder-pressed with the hand-operated press and then pressed under pressure at 2 tonf/cm$^2$ with the hydrostatic press. Next, the compact was sintered at 1,220° C. for 6 hours in the atmosphere as first firing, and then the temperature was soon raised up to 1,300° C. so that the compact was sintered for 25 hours additionally for second firing.

After firing, each sintered body was processed into a cylinder of a 6-mm diameter and an 8-mm height. Then, the sintered body was subjected to density measurement and X-ray diffraction to check the components. Then, gold was deposited on both edges of the sintered body and the sintered body was polarized under a condition of 8 V/mm (at 180° C.). Thereafter, the piezoelectric constants $d_{33}$ and $K_{33}$, and a relative dielectric constant were measured. Further, microstructures of the sintered body were evaluated by use of the SEM. Grain sizes of the sintered body were defined as average grain lengths intersecting 10 parallel straight lines drawn on a SEM image. The results are shown in Table 14 and Table 15.

Examples 47 to 54, and Comparative Examples 38 and 39
Table 16 and Table 17

Commercially available $SrCO_3$, $BaCO_3$, MgO, $Na_2CO_3$ and $Nb_2O_5$ were prepared and these reagents were weighed

TABLE 14

| Classifications | Comparative Example 36 | Example 39 | Example 40 | Example 41 | Example 42 |
|---|---|---|---|---|---|
| X value in matrix $Sr_{2-x}A_xNaNb_5O_{15}$ (A = $A_1$ + $A_3$) | 0.05 | 0.1 | 0.1 | 0.1 | 0.1 |
| $A_1$: Ca | 0.025 | 0.01 | 0.03 | 0.07 | 0.09 |
| $A_3$: Mg | 0.025 | 0.09 | 0.07 | 0.03 | 0.01 |
| Conditions of synthesis | | | | | |
| Calcining temperature (° C.) | 1150 | 1150 | 1150 | 1150 | 1150 |
| Calcining time (hr) | 6 | 6 | 6 | 6 | 6 |
| Calcining ambiance | atmospheric | atmospheric | atmospheric | atmospheric | atmospheric |
| Conditions of sintering | | | | | |
| $1^{st}$ firing temperature (° C.) | 1220 | 1220 | 1220 | 1220 | 1220 |
| $1^{st}$ firing time (hr) | 6 | 6 | 6 | 6 | 6 |
| $2^{nd}$ firing temperature (° C.) | 1300 | 1300 | 1300 | 1300 | 1300 |
| $2^{nd}$ firing time (hr) | 25 | 25 | 25 | 25 | 25 |
| Firing ambiance | atmospheric | atmospheric | atmospheric | atmospheric | atmospheric |
| Grain sizes after sintering ($\mu$m) | 6 | 5 | 5 | 5 | 5 |
| Characteristic values | | | | | |
| Density ($10^{-3}$ kg/m$^3$) | 4.91 | 4.92 | 4.9 | 4.88 | 4.89 |
| Relative dielectric constant | 1400 | 1500 | 1450 | 1500 | 1520 |
| $K_{33}$ (%) | 28 | 35 | 34 | 35 | 33 |
| $D_{33}$ (pC/N) | 180 | 250 | 250 | 260 | 250 |
| Overall judgment | NG | OK | OK | OK | OK |

TABLE 15

| Classifications | Example 43 | Example 44 | Example 45 | Example 46 | Comparative Example 37 |
|---|---|---|---|---|---|
| X value in matrix $Sr_{2-x}A_xNaNb_5O_{15}$ (A = $A_1$ + $A_3$) | 0.2 | 0.2 | 0.2 | 0.2 | 0.3 |
| $A_1$: Ca | 0.02 | 0.06 | 0.14 | 0.18 | 0.15 |
| $A_3$: Mg | 0.18 | 0.14 | 0.06 | 0.02 | 0.15 |
| Conditions of synthesis | | | | | |
| Calcining temperature (° C.) | 1150 | 1150 | 1150 | 1150 | 1150 |
| Calcining time (hr) | 6 | 6 | 6 | 6 | 6 |
| Calcining ambiance | atmospheric | atmospheric | atmospheric | atmospheric | atmospheric |
| Conditions of sintering | | | | | |
| $1^{st}$ firing temperature (° C.) | 1220 | 1220 | 1220 | 1220 | 1220 |
| $1^{st}$ firing time (hr) | 6 | 6 | 6 | 6 | 6 |
| $2^{nd}$ firing temperature (° C.) | 1300 | 1300 | 1300 | 1300 | 1300 |
| $2^{nd}$ firing time (hr) | 25 | 25 | 25 | 25 | 25 |
| Firing ambiance | atmospheric | atmospheric | atmospheric | atmospheric | atmospheric |
| Grain sizes after sintering ($\mu$m) | 5 | 5 | 5 | 5 | 5 |
| Characteristic values | | | | | |
| Density ($10^{-3}$ kg/m$^3$) | 4.92 | 4.91 | 4.9 | 4.9 | 4.92 |
| Relative dielectric constant | 1520 | 1500 | 1500 | 1500 | 1560 |
| $K_{33}$ (%) | 36 | 37 | 35 | 34 | 30 |
| $D_{33}$ (pC/N) | 255 | 260 | 250 | 250 | 200 |
| Overall judgment | OK | OK | OK | OK | NG |

According to the evaluation results, as shown in Table 14 and Table 15, the piezoelectric constant $d_{33}$ was low and therefore not preferable as an actuator material in Comparative Example 36 or 37 where the x value was 0.05 or 0.3. On the contrary, the piezoelectric constant $d_{33}$ was high and preferable as an actuator material in each of Examples 39 to 46 where x=0.075 to 0.25 were satisfied.

such that the x value in the component composition defined as $Sr_{2-x}(Mg+Ba)_xNaNb_5O_{15}$ (which is the component composition as described previously where A=$A_2$+$A_3$, and $A_2$ is Ba and $A_3$ is Mg, respectively) was set to a range from 0.05 to 0.3 to prepare several types of blended powder. Then, each blended powder was subjected to blending and milling for 24 hours in alcohol by use of the ball mill. Subsequently, the blended slurry was dried by use of the rotary evaporator and then subjected to calcining at 1,150° C. for 6 hours in the atmosphere to cause reaction among the elements. Then, the calcined material was again subjected to milling for 24 hours in alcohol using the ball mill. The ball-milled powder was dried by use of the rotary evaporator. Thereafter, the ball-milled powder was powder-pressed with the hand-operated press and then pressed under pressure at 2 tonf/cm2 with the hydrostatic press. Next, a compact was sintered at 1,220° C. for 6 hours in the atmosphere as first firing, and then the temperature was soon raised up to 1,300° C. so that the compact was sintered for 25 hours additionally for second firing.

After firing, each sintered body was processed into a cylinder of a 6-mm diameter and an 8-mm height. Then, the sintered body was subjected to density measurement and X-ray diffraction to check the components. Then, gold was deposited on both edges of the sintered body and the sintered body was polarized under a condition of 8 V/mm (180° C.). Thereafter, the piezoelectric constants $d_{33}$ and $K_{33}$, and a relative dielectric constant were measured. Further, microstructures of the sintered body were evaluated by use of the SEM. Grain sizes of the sintered body were defined as average grain lengths intersecting 10 parallel straight lines drawn on a SEM image. The results are shown in Table 16 and Table 17.

TABLE 16

| Classifications | Comparative Example 38 | Example 47 | Example 48 | Example 49 | Example 50 |
|---|---|---|---|---|---|
| X value in matrix $Sr_{2-x}A_xNaNb_5O_{15}$ (A = $A_2$ + $A_3$) | 0.05 | 0.1 | 0.1 | 0.1 | 0.1 |
| $A_2$: Ba | 0.025 | 0.01 | 0.03 | 0.07 | 0.09 |
| $A_3$: Mg | 0.025 | 0.09 | 0.07 | 0.03 | 0.01 |
| Conditions of synthesis | | | | | |
| Calcining temperature (° C.) | 1150 | 1150 | 1150 | 1150 | 1150 |
| Calcining time (hr) | 6 | 6 | 6 | 6 | 6 |
| Calcining ambiance | atmospheric | atmospheric | atmospheric | atmospheric | atmospheric |
| Conditions of sintering | | | | | |
| 1st firing temperature (° C.) | 1220 | 1220 | 1220 | 1220 | 1220 |
| 1st firing time (hr) | 6 | 6 | 6 | 6 | 6 |
| 2nd firing temperature (° C.) | 1300 | 1300 | 1300 | 1300 | 1300 |
| 2nd firing time (hr) | 25 | 25 | 25 | 25 | 25 |
| Firing ambiance | atmospheric | atmospheric | atmospheric | atmospheric | atmospheric |
| Grain sizes after sintering (μm) | 6 | 5 | 5 | 5 | 5 |
| Characteristic values | | | | | |
| Density ($10^{-3}$ kg/m$^3$) | 4.9 | 4.89 | 4.9 | 4.91 | 4.9 |
| Relative dielectric constant | 1400 | 1500 | 1520 | 1600 | 1520 |
| $K_{33}$ (%) | 28 | 35 | 34 | 34 | 36 |
| $D_{33}$ (pC/N) | 160 | 250 | 255 | 260 | 250 |
| Overall judgment | NG | OK | OK | OK | OK |

TABLE 17

| Classifications | Example 51 | Example 52 | Example 53 | Example 54 | Comparative Example 39 |
|---|---|---|---|---|---|
| X value in matrix $Sr_{2-x}A_xNaNb_5O_{15}$ (A = $A_2$ + $A_3$) | 0.2 | 0.2 | 0.2 | 0.2 | 0.3 |
| $A_2$: Ba | 0.02 | 0.06 | 0.14 | 0.18 | 0.15 |
| $A_3$: Mg | 0.18 | 0.14 | 0.06 | 0.02 | 0.15 |
| Conditions of synthesis | | | | | |
| Calcining temperature (° C.) | 1150 | 1150 | 1150 | 1150 | 1150 |
| Calcining time (hr) | 6 | 6 | 6 | 6 | 6 |
| Calcining ambiance | atmospheric | atmospheric | atmospheric | atmospheric | atmospheric |
| Conditions of sintering | | | | | |
| 1st firing temperature (° C.) | 1220 | 1220 | 1220 | 1220 | 1220 |
| 1st firing time (hr) | 6 | 6 | 6 | 6 | 6 |
| 2nd firing temperature (° C.) | 1300 | 1300 | 1300 | 1300 | 1300 |
| 2nd firing time (hr) | 25 | 25 | 25 | 25 | 25 |
| Firing ambiance | atmospheric | atmospheric | atmospheric | atmospheric | atmospheric |
| Grain sizes after sintering (μm) | 5 | 5 | 5 | 5 | 5 |
| Characteristic values | | | | | |
| Density ($10^{-3}$ kg/m$^3$) | 4.93 | 4.92 | 4.91 | 4.9 | 4.9 |
| Relative dielectric constant | 1510 | 1520 | 1520 | 1540 | 1530 |
| $K_{33}$ (%) | 35 | 35 | 35 | 35 | 25 |
| $D_{33}$ (pC/N) | 250 | 260 | 250 | 260 | 200 |
| Overall judgment | OK | OK | OK | OK | NG |

According to the evaluation results, as shown in Table 16 and Table 17, the piezoelectric constant $d_{33}$ was low and therefore not preferable as an actuator material in Comparative Examples 38 or 39 where the x value was 0.05 or 0.3. On the contrary, the piezoelectric constant $d_{33}$ was high and preferable as an actuator material in each of Examples 47 to 54 where x=0.075 to 0.25 were satisfied.

Examples 55 to 62, and Comparative Examples 40 and 41

Table 18 and Table 19

Commercially available $SrCO_3$, $CaCO_3$, $BaCO_3$, MgO, $Na_2CO_3$ and $Nb_2O_5$ were prepared and these reagents were weighed such that the x value in the component composition defined as $Sr_{2-x}(Ca+Ba+Mg)_xNaNb_5O_{15}$ (which is the component composition as described previously where $A=A_1+A_2+A_3$, and $A_1$ is Ca, $A_2$ is Ba, and $A_3$ is Mg, respectively) was set to a range from 0.05 to 0.3 to prepare several types of blended powder. Then, each blended powder was subjected to blending and milling for 24 hours in alcohol by use of the ball mill. Subsequently, the blended slurry was dried by use of the rotary evaporator and then subjected to calcining at 1,150° C. for 6 hours in the atmosphere to cause reaction among the elements. Then, the calcined material was again subjected to milling for 24 hours in alcohol using the ball mill. The ball-milled powder was dried by use of the rotary evaporator. Thereafter, the milled powder was powder-pressed with the hand-operated press and then pressed under pressure at 2 tonf/cm2 with the hydrostatic press. Next, a compact was sintered at 1,220° C. for 6 hours in the atmosphere as first firing, and then the temperature was soon raised up to 1,300° C. so that the compact was sintered for 25 hours additionally for second firing.

After firing, each sintered body was processed into a cylinder of a 6-mm diameter and an 8-mm height. Then, the sintered body was subjected to density measurement and X-ray diffraction to check the components. Then, gold was deposited on both edges of the sintered body and the sintered body was polarized under a condition of 8 V/mm (at 180° C.). Thereafter, the piezoelectric constants $d_{33}$ and $K_{33}$, and a relative dielectric constant were measured. Further, microstructures of the sintered body were evaluated by use of the SEM. Grain sizes of the sintered body were defined as average grain lengths intersecting 10 parallel straight lines drawn on a SEM image. The results are shown in Table 18 and Table 19.

TABLE 18

| Classifications | Comparative Example 40 | Example 55 | Example 56 | Example 57 | Example 58 |
|---|---|---|---|---|---|
| X value in matrix $Sr_{2-x}A_xNaNb_5O_{15}$ ($A = A_1 + A_2 + A_3$) | 0.05 | 0.1 | 0.1 | 0.1 | 0.1 |
| $A_1$: Ca | 0.02 | 0.033 | 0.08 | 0.01 | 0.01 |
| $A_2$: Ba | 0.02 | 0.033 | 0.01 | 0.08 | 0.01 |
| $A_3$: Mg | 0.01 | 0.033 | 0.01 | 0.01 | 0.08 |
| Conditions of synthesis | | | | | |
| Calcining temperature (° C.) | 1150 | 1150 | 1150 | 1150 | 1150 |
| Calcining time (hr) | 6 | 6 | 6 | 6 | 6 |
| Calcining ambiance | atmospheric | atmospheric | atmospheric | atmospheric | atmospheric |
| Conditions of sintering | | | | | |
| 1st firing temperature (° C.) | 1220 | 1220 | 1220 | 1220 | 1220 |
| 1st firing time (hr) | 6 | 6 | 6 | 6 | 6 |
| 2nd firing temperature (° C.) | 1300 | 1300 | 1300 | 1300 | 1300 |
| 2nd firing time (hr) | 25 | 25 | 25 | 25 | 25 |
| Firing ambiance | atmospheric | atmospheric | atmospheric | atmospheric | atmospheric |
| Grain sizes after sintering (μm) | 6 | 5 | 5 | 5 | 5 |
| Characteristic values | | | | | |
| Density ($10^{-3}$ kg/m$^3$) | 4.9 | 4.9 | 4.9 | 4.9 | 4.9 |
| Relative dielectric constant | 1500 | 1500 | 1600 | 1550 | 1540 |
| $K_{33}$ (%) | 28 | 35 | 34 | 35 | 35 |
| $D_{33}$ (pC/N) | 180 | 250 | 260 | 250 | 255 |
| Overall judgment | NG | OK | OK | OK | OK |

TABLE 19

| Classifications | Example 59 | Example 60 | Example 61 | Example 62 | Comparative Example 41 |
|---|---|---|---|---|---|
| X value in matrix $Sr_{2-x}A_xNaNb_5O_{15}$ ($A = A_1 + A_2 + A_3$) | 0.2 | 0.2 | 0.2 | 0.2 | 0.3 |
| $A_1$: Ca | 0.067 | 0.18 | 0.01 | 0.01 | 0.1 |
| $A_2$: Ba | 0.067 | 0.01 | 0.18 | 0.01 | 0.1 |
| $A_3$: Mg | 0.067 | 0.01 | 0.01 | 0.18 | 0.1 |
| Conditions of synthesis | | | | | |
| Calcining temperature (° C.) | 1150 | 1150 | 1150 | 1150 | 1150 |
| Calcining time (hr) | 6 | 6 | 6 | 6 | 6 |

TABLE 19-continued

| Classifications | Example 59 | Example 60 | Example 61 | Example 62 | Comparative Example 41 |
|---|---|---|---|---|---|
| Calcining ambiance | Atmospheric | atmospheric | atmospheric | atmospheric | atmospheric |
| Conditions of sintering | | | | | |
| 1st firing temperature (° C.) | 1220 | 1220 | 1220 | 1220 | 1220 |
| 1st firing time (hr) | 6 | 6 | 6 | 6 | 6 |
| 2nd firing temperature (° C.) | 1300 | 1300 | 1300 | 1300 | 1300 |
| 2nd firing time (hr) | 25 | 25 | 25 | 25 | 25 |
| Firing ambiance | Atmospheric | atmospheric | atmospheric | atmospheric | atmospheric |
| Grain sizes after sintering (μm) | 5 | 5 | 5 | 5 | 5 |
| Characteristic values | | | | | |
| Density ($10^{-3}$ kg/m$^3$) | 4.9 | 4.9 | 4.9 | 4.9 | 4.9 |
| Relative dielectric constant | 1520 | 1500 | 1510 | 1510 | 1500 |
| $K_{33}$ (%) | 35 | 36 | 34 | 35 | 28 |
| $D_{33}$ (pC/N) | 250 | 260 | 250 | 255 | 180 |
| Overall judgment | OK | OK | OK | OK | NG |

According to the evaluation results, as shown in Table 18 and Table 19, the piezoelectric constant $d_{33}$ was low and therefore not preferable as an actuator material in Comparative Examples 40 or 41 where the x value was 0.05 or 0.3. On the contrary, the piezoelectric constant $d_{33}$ was high and preferable as an actuator material in each of Examples 55 to 62 where x=0.075 to 0.25 were satisfied.

Examples 63 to 70, and Comparative Examples 42 Table 20 and Table 21

Commercially available $SrCO_3$, $CaCO_3$, $BaCO_3$, MgO, $Na_2CO_3$ and $Nb_2O_5$ were prepared and these reagents were weighed so as to constitute $Sr_{1.9}(Ca+Ba+Mg)_{0.1}NaNb_5O_{15}$ or $Sr_{1.8}(Ca+Ba+Mg)_{0.2}NaNb_5O_{15}$, whereby several types of blended powder were prepared. Then, each blended powder was subjected to blending and milling for 24 hours in alcohol by use of the ball mill. Subsequently, the blended slurry was dried by use of the rotary evaporator and then subjected to calcining at a temperature in a range from 1,050° C. to 1,175° C. for 1 to 15 hours in the atmosphere to cause reaction among the elements. Then, the calcined material was again subjected to crushing for 24 hours in alcohol using the ball mill. The ball-milled powder was dried by use of the rotary evaporator. Thereafter, the ball-milled powder was powder-pressed with the hand-operated press and then pressed under pressure at 2 tonf/cm2 with the hydrostatic press.

Next, a compact was sintered at a temperature in a range from 1,180° C. to 1,270° C. for 3 to 10 hours in the atmosphere as first firing, and then the temperature was soon raised up to a temperature in a range from 1,270° C. to 1,370° C. so that the compact was sintered for 10 to 50 hours additionally for second firing.

After firing, each sintered body was processed into a cylinder of a 6-mm diameter and an 8-mm height. Then, the sintered body was subjected to density measurement and X-ray diffraction to check the components. Then, gold was deposited on both edges of the sintered body and the sintered body was polarized under a condition of 8 V/mm (at 180° C.). Thereafter, the piezoelectric constants $d_{33}$ and $K_{33}$, and a relative dielectric constant were measured. Further, microstructures of the sintered body were evaluated by use of the SEM. Grain sizes of the sintered body were defined as average grain lengths intersecting 10 parallel straight lines drawn on a SEM image. The results are shown in Table 20 and Table 21.

TABLE 20

| Classifications | Comparative Example 42 | Example 63 | Example 64 | Comparative Example 43 | Comparative Example 44 | Example 65 |
|---|---|---|---|---|---|---|
| X value in matrix $Sr_{2-x}A_xNaNb_5O_{15}$ (A = $A_1 + A_2 + A_3$) | 0.1 | 0.1 | 0.1 | 0.1 | 0.1 | 0.1 |
| $A_1$: Ca | 0.0333 | 0.0333 | 0.0333 | 0.0333 | 0.0333 | 0.0333 |
| $A_2$: Ba | 0.0333 | 0.0333 | 0.0333 | 0.0333 | 0.0333 | 0.0333 |
| $A_3$: Mg | 0.0333 | 0.0333 | 0.0333 | 0.0333 | 0.0333 | 0.0333 |
| Conditions of synthesis | | | | | | |
| Calcining temperature (° C.) | 1050 | 1100 | 1150 | 1175 | 1150 | 1150 |
| Calcining time (hr) | 15 | 10 | 6 | 3 | 1 | 6 |
| Calcining ambiance | atmospheric | atmospheric | atmospheric | atmospheric | atmospheric | atmospheric |
| Conditions of sintering | | | | | | |
| 1st firing temperature (° C.) | 1220 | 1220 | 1220 | 1220 | 1180 | 1200 |
| 1st firing time (hr) | 6 | 6 | 6 | 6 | 6 | 6 |
| 2nd firing temperature (° C.) | 1300 | 1300 | 1300 | 1300 | 1370 | 1370 |
| 2nd firing time (hr) | 25 | 25 | 25 | 25 | 25 | 10 |
| Firing ambiance | atmospheric | atmospheric | atmospheric | atmospheric | atmospheric | atmospheric |
| Grain sizes after sintering (μm) | 5 | 6 | 5 | 5 | 5 | 12 |

TABLE 20-continued

| Classifications | Comparative Example 42 | Example 63 | Example 64 | Comparative Example 43 | Comparative Example 44 | Example 65 |
|---|---|---|---|---|---|---|
| Characteristic values | | | | | | |
| Density ($10^{-3}$ kg/m$^3$) | 4.9 | 4.86 | 4.88 | 4.75 | 4.7 | 4.91 |
| Relative dielectric constant | 1500 | 1500 | 1450 | 1450 | | 1600 |
| $K_{33}$ (%) | 28 | 35 | 34 | 28 | | 35 |
| $D_{33}$ (pC/N) | 180 | 250 | 250 | 180 | unpolarizable | 260 |
| Overall judgment | NG | OK | OK | NG | NG | OK |

TABLE 21

| Classifications | Example 66 | Example 67 | Example 68 | Comparative Example 45 | Example 69 | Example 70 |
|---|---|---|---|---|---|---|
| X value in matrix $Sr_{2-x}A_xNaNb_5O_{15}$ ($A = A_1 + A_2 + A_3$) | 0.1 | 0.1 | 0.1 | 0.1 | 0.2 | 0.2 |
| $A_1$: Ca | 0.0333 | 0.0333 | 0.0333 | 0.0333 | 0.067 | 0.067 |
| $A_2$: Ba | 0.0333 | 0.0333 | 0.0333 | 0.0333 | 0.067 | 0.067 |
| $A_3$: Mg | 0.0333 | 0.0333 | 0.0333 | 0.0333 | 0.067 | 0.067 |
| Conditions of synthesis | | | | | | |
| Calcining temperature (° C.) | 1150 | 1150 | 1150 | 1150 | 1150 | 1150 |
| Calcining time (hr) | 6 | 6 | 6 | 6 | 6 | 6 |
| Calcining ambiance | atmospheric | atmospheric | atmospheric | atmospheric | atmospheric | atmospheric |
| Conditions of sintering | | | | | | |
| 1$^{st}$ firing temperature (° C.) | 1250 | 1250 | 1250 | 1270 | 1200 | 1250 |
| 1$^{st}$ firing time (hr) | 6 | 6 | 6 | 6 | 6 | 6 |
| 2$^{nd}$ firing temperature (° C.) | 1350 | 1300 | 1270 | 1270 | 1300 | 1300 |
| 2$^{nd}$ firing time (hr) | 25 | 40 | 50 | 25 | 50 | 10 |
| Firing ambiance | atmospheric | atmospheric | atmospheric | atmospheric | atmospheric | atmospheric |
| Grain sizes after sintering (μm) | 10 | 15 | 20 | 30 | 5 | 5 |
| Characteristic values | | | | | | |
| Density ($10^{-3}$ kg/m$^3$) | 4.85 | 4.9 | 4.85 | 4.7 | 4.85 | 4.85 |
| Relative dielectric constant | 1500 | 1550 | 1400 | 1300 | 1450 | 1450 |
| $K_{33}$ (%) | 35 | 36 | 34 | 27 | 34 | 34 |
| $D_{33}$ (pC/N) | 250 | 250 | 260 | 180 | 255 | 250 |
| Overall judgment | OK | OK | OK | NG | OK | OK |

According to the evaluation results, as shown in Table 20 and Table 21, the piezoelectric constant $d_{33}$ reached 250 pC/N or higher and was approved preferable as an actuator material, in the case when the synthesizing temperature (the calcining temperature) was set in a range from 1,050° C. to 1,150° C. in the atmosphere associated with the calcining time in a range from 2 to 12 hours, the first firing temperature was set in a range from 1,200° C. to 1,250° C. in the atmosphere associated with the firing time in a range from 4 to 8 hours, and the second firing temperature was set in a range from 1,270° C. to 1,370° C. in the atmosphere associated with the firing time in a range from 10 to 50 hours.

The entire contents of Japanese Patent Applications H10-273847 (filed Sep. 28, 1998) and H11-167873 (filed Jun. 15, 1999) are incorporated herein by reference. Although the invention has been described above by reference to certain embodiments of the invention, the invention is not limited to the embodiments described above. Modifications and variations of the embodiments described above will occur to those skilled in the art, in light of the above teachings.

What is claimed is:

1. A piezoelectric material, comprising:
   a polycrystalline compound defined as $Sr_{2-x}Ca_xNaNb_5O_{15}$; and
   at least one rare earth oxide selected from the group consisting of $Y_2O_3$, $La_2O_3$, $Dy_2O_3$, $Nd_2O_3$, $Yb_2O_3$, $Sm_2O_3$, $Er_2O_3$, $Gd_2O_3$ and $Pr_6O_{11}$,
   wherein the x is set in a range from 0.05 to 0.35, and
   a content of the rare earth oxide is set in a range from 0.5 to 3.0 wt %.

2. The piezoelectric material according to claim 1, wherein the x is set in a range from 0.1 to 0.2.

3. The piezoelectric material according to claim 1, wherein the rare earth oxide is $La_2O_3$ and the x is set to about 0.1.

4. The piezoelectric material according to claim 3, wherein a content of the $La_2O_3$ is set to about 2 wt %.

5. The piezoelectric material according to claim 1, wherein the piezoelectric material is a sintered body, and an average grain size of the sintered body determined by averaging diameters of grains intersecting a plurality of parallel lines drawn on an electron microscopic image of the sintered body is in a range from 3 μm to 20 μm.

6. An actuator, comprising:
   the piezoelectric material according to claim 1.

7. The actuator according to claim 6, wherein the piezoelectric material is a sintered body, and an average grain size of the sintered body determined by averaging diameters of grains intersecting a plurality of parallel lines drawn on an electron microscopic image of the sintered body is in a range from 3 μm to 20 μm.

8. A method of manufacturing the piezoelectric material according to claim 1, comprising:

blending raw materials for composing the polycrystalline compound and the rare earth oxide;

synthesizing a material by calcining the blended materials obtained by the blending process, the synthesizing being performed under a condition at a temperature range from 1,050° C. to 1,150° C. for a time period in a range from 2 to 12 hours;

milling calcined material obtained by the synthesizing process;

pressing milled powder obtained by the milling process; and sintering a compact obtained by the pressing process.

9. The method according to claim 8, wherein the sintering process comprises:

first firing the compact at a temperature in a range from 1,180° C. to 1,270° C. for a time period in a range from 4 to 8 hours; and second firing the compact after the first firing at a temperature in a range from 1,370° C. to 1,400° C. for a time period in a range from 10 to 75 hours.

10. The method according to claim 9, wherein the second firing is performed continuously to the first firing without reducing the temperature.

11. The method according to claim 9, wherein the calcining in the synthesizing process and the first and second firing in the sintering process are conducted in atmospheric ambiance.

12. The method according to claim 8, wherein the compact is composed of powder having grain sizes in a range from 0.5 μm to 0.8 μm.

13. A piezoelectric material, comprising:

a polycrystalline compound defined as $Sr_{2-x}A_xNaNb_5O_{15}$, wherein the x is set in a range from 0.075 to 0.25, and the A includes at least two elements selected from the group consisting of Ca, Ba and Mg.

14. An actuator, comprising:

the piezoelectric material according to claim 13.

15. A method of manufacturing the piezoelectric material according to claim 13, comprising:

blending raw materials for composing the polycrystalline compound;

synthesizing a material by calcining the blended materials obtained by the blending process, the synthesizing being performed under a condition at a temperature range from 1,050° C. to 1,150° C. for a time period in a range from 2 to 12 hours;

milling calcined material obtained by the synthesizing process;

pressing powder obtained by the milling process; and sintering a compact obtained by the pressing process.

16. The method according to claim 15, wherein the sintering comprises:

first firing the compact at a temperature in a range from 1,200° C. to 1,250° C. for a time period in a range from 4 to 8 hours; and second firing the compact after the first firing at a temperature in a range from 1,270° C. to 1,370° C. for a time period in a range from 10 to 50 hours.

17. The method according to claim 16, wherein the second firing is performed continuously to the first firing without reducing the temperature.

18. The method according to claim 16, wherein the calcining in the synthesizing process and the first and second firing in the sintering process are conducted in atmospheric ambiance.

* * * * *